(12) United States Patent
Hirata et al.

(10) Patent No.: US 8,179,941 B2
(45) Date of Patent: May 15, 2012

(54) LASER DIODE AND METHOD OF MANUFACTURING THE SAME

(75) Inventors: Shoji Hirata, Kanagawa (JP);
Tsunenori Asatsuma, Kanagawa (JP);
Yoshiro Takiguchi, Kanagawa (JP)

(73) Assignee: Sony Corporation, Tokyo (JP)

(*) Notice: Subject to any disclaimer, the term of this patent is extended or adjusted under 35 U.S.C. 154(b) by 0 days.

(21) Appl. No.: 13/099,503

(22) Filed: May 3, 2011

(65) Prior Publication Data

US 2011/0206080 A1  Aug. 25, 2011

Related U.S. Application Data

(62) Division of application No. 12/237,547, filed on Sep. 25, 2008, now Pat. No. 7,965,749.

(30) Foreign Application Priority Data

Oct. 3, 2007  (JP) ................................. 2007-259429

(51) Int. Cl.
*H01S 5/00* (2006.01)
(52) U.S. Cl. ................................. 372/44.01; 372/45.01
(58) Field of Classification Search ............... 372/43.01, 372/44.01, 45.01
See application file for complete search history.

(56) References Cited

U.S. PATENT DOCUMENTS

| 4,791,651 A * | 12/1988 | Taneya et al. ............... 372/50.12 |
| 2001/0026567 A1 * | 10/2001 | Kaneko et al. ................. 372/43 |

FOREIGN PATENT DOCUMENTS

| JP | 55-013991 | 1/1980 |
| JP | 63-081996 | 4/1988 |
| JP | 63-084086 | 4/1988 |
| JP | 64-022088 | 1/1989 |
| JP | 64-025591 | 1/1989 |
| JP | 02-192786 | 7/1990 |
| JP | 2003-031906 | 1/2003 |
| JP | 2003-060288 | 2/2003 |
| JP | 2004-221384 | 8/2004 |
| JP | 2004-221385 | 8/2004 |
| JP | 2004-273955 | 9/2004 |
| JP | 2005-116728 | 4/2005 |
| JP | 2006-269988 | 10/2006 |

* cited by examiner

*Primary Examiner* — Armando Rodriguez
(74) *Attorney, Agent, or Firm* — SNR Denton US LLP

(57) ABSTRACT

A laser diode which realizes NFP with a stable and uniform shape. The laser diode includes, on a semiconductor substrate, an active layer, one or a plurality of strip-shaped current confinement structures confining a current which is injected into the active layer, and a stacked structure including one or a plurality of strip-shaped convex portions extending in an extending direction of the current confinement structure.

22 Claims, 25 Drawing Sheets

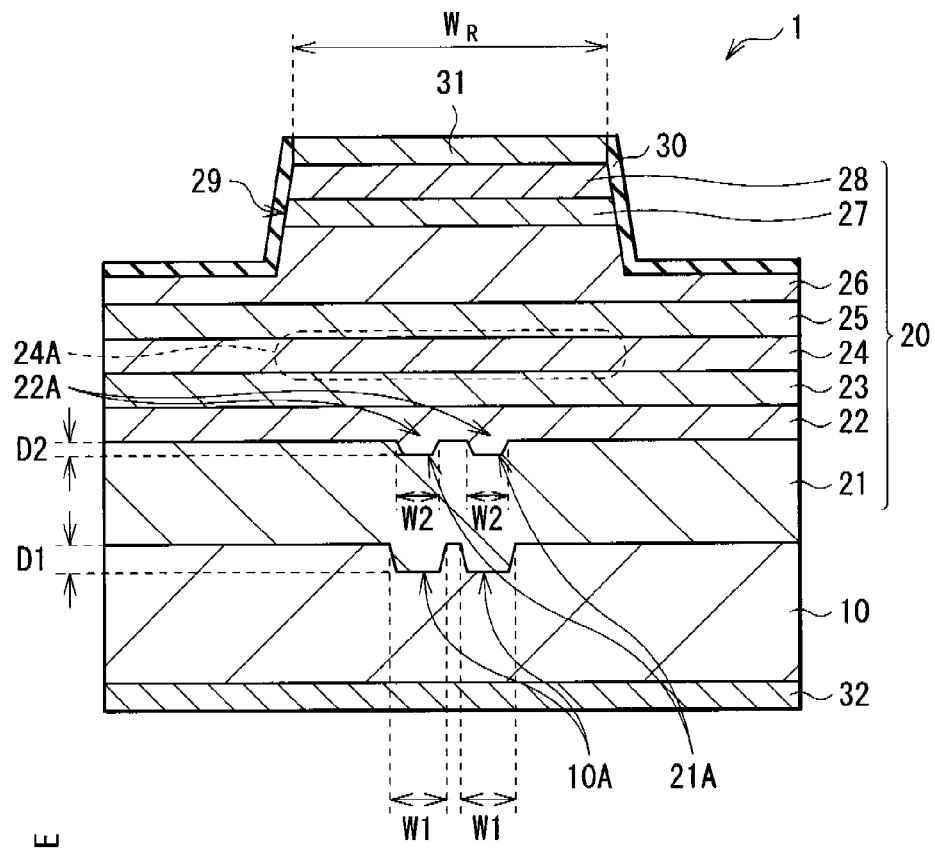
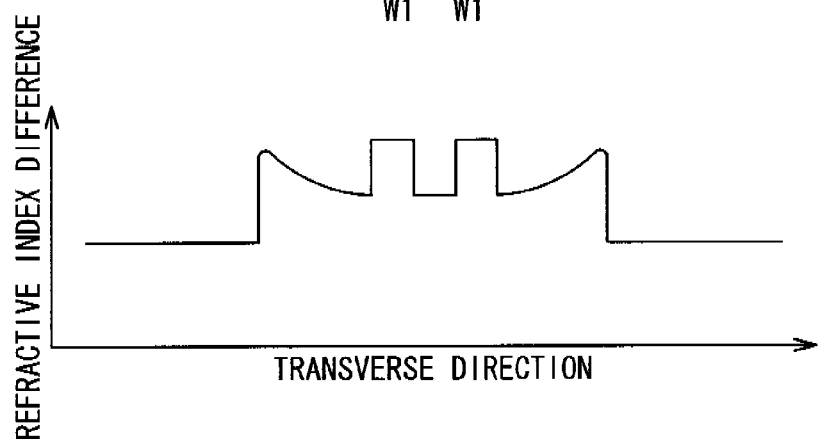
FIG. 4A
FIG. 4B

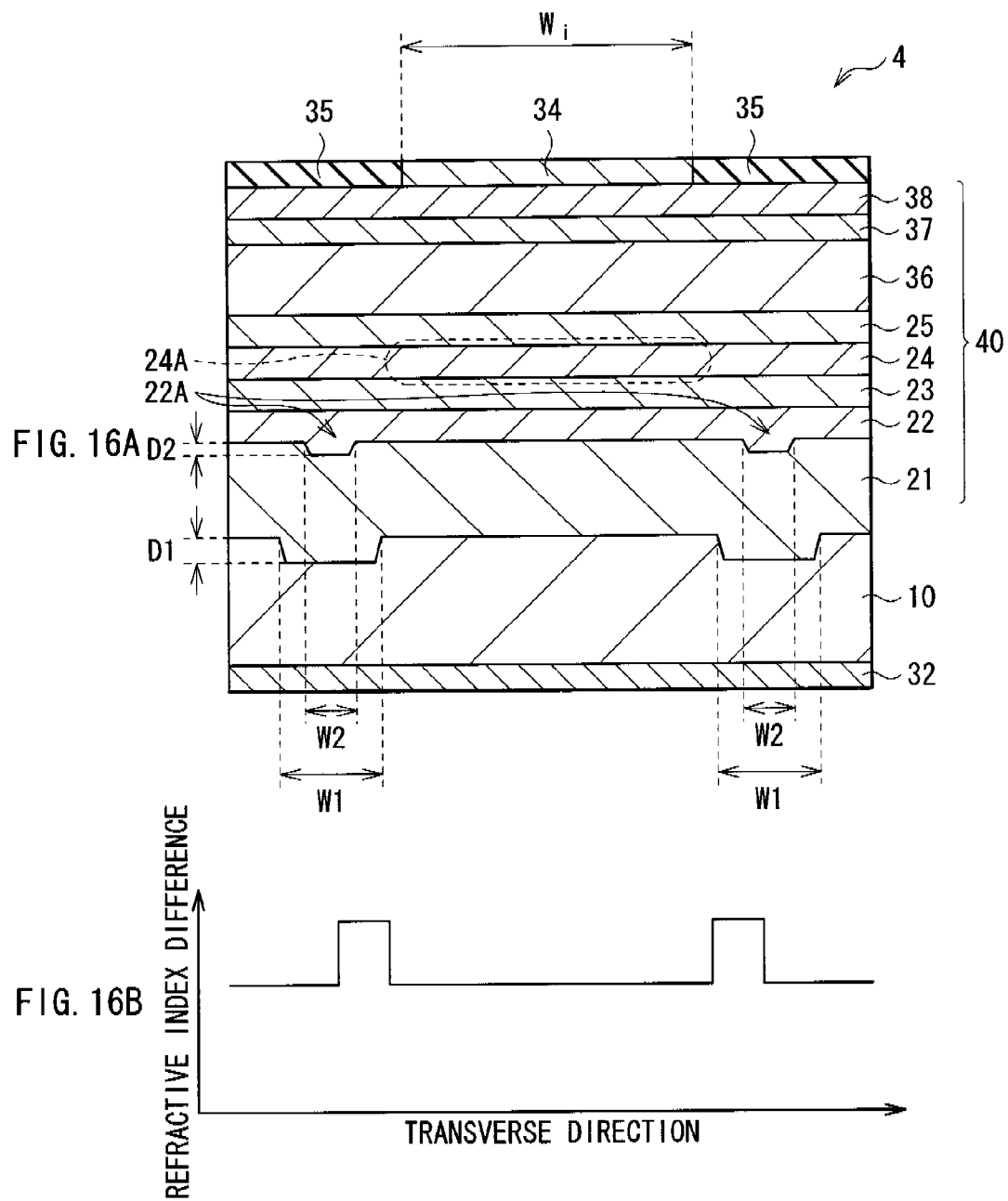

LASER DIODE AND METHOD OF MANUFACTURING THE SAME

This application is a division of U.S. patent application Ser. No. 12/237,547, filed Sep. 25, 2008, the entirety of which is incorporated herein by reference to the extent permitted by law. The present application claims the benefit of priority to Japanese Patent Application No. JP 2007-259429 filed in the Japanese Patent Office on Oct. 3, 2007, the entirety of which is incorporated by reference herein to the extent permitted by law.

BACKGROUND OF THE INVENTION

The present invention relates to a laser diode having one or a plurality of current confinement structures, and in particular, relates to a broad-area laser diode suitable for high output applications and a method of manufacturing the same.

As a compact and low-cost laser light source with high reliability and high output capability, a so-called broad-area laser diode including a waveguide with its width (i.e. stripe width) widened has been utilized in various fields such as displays, printing products, initialization devices of optical disks, fabricating materials, and medical applications. In a typical broad-area laser diode, a stripe width is at least 5 μm or above. In many cases, the stripe width is 10 μm or above, and several hundred μm as a maximum. As a technique related to the broad-area laser diode, there is known a technique, for example, described in Japanese Unexamined Patent Publication No. 2003-60288.

SUMMARY OF THE INVENTION

However, in the broad-area laser diode, the high-order mode may be arbitrarily generated and the filament emission may further be produced. Thus, control of NFP is difficult, and NFP with a stable and uniform shape (top-hat shape) may hardly be obtained. Even in the case of NFP with a stable and uniform shape under a certain condition, a change in temperature, injection current, or electric power may cause that the NFP is likely fluctuated and has a nonuniform shape.

Therefore, in the application in which the stable and uniform NFP is desired, for example in the case where the broad-area laser diode is applied to a display, there is a risk that the display quality is degraded, because of generation of flicker, nonuniformity of brightness on the screen, or the like.

In view of the forgoing, it is desirable to provide a laser diode which enables NFP with a stable and uniform shape, and a method of manufacturing the same.

According to an embodiment of the present invention, there is provided a first laser diode having, on a semiconductor substrate, an active layer, one or a plurality of strip-shaped current confinement structures confining a current which is injected into the active layer, and a stacked structure including one or a plurality of strip-shaped convex portions extending in an extending direction of the current confinement structure.

In the first laser diode according to an embodiment of the present invention, one or a plurality of strip-shaped convex portions extending in the extending direction of the current confinement structure are provided within the stacked structure. Thereby, light emitted in the active layer is guided by a waveguide structure corresponding to a refractive index distribution formed by the current confinement structure and the convex portion.

According to another embodiment of the present invention, there is provided a second laser diode having an active layer, and a stacked structure including one or a plurality of strip-shaped current confinement structures confining a current which is injected into the active layer. The current confinement structure is in a ridge shape, and includes one or a plurality of strip-shaped concave portions extending in an extending direction of the current confinement structure, the concave portions disposed in an upper part of the current confinement structure in the ridge shape.

In the second laser diode according to another embodiment of the present invention, one or a plurality of strip-shaped concave portions extending in the extending direction of the current confinement structure are provided in the upper part of the current confinement structure in the ridge shape. Thereby, light emitted in the active layer is guided by a waveguide structure corresponding to a refractive index distribution formed by the current confinement structure and the concave portion.

According to another embodiment of the present invention, there is provided a third laser diode having an active layer, and a stacked structure including one or a plurality of strip-shaped current confinement structures confining a current which is injected into the active layer. The current confinement structure includes a pair of high resistance regions with a current injection region in between, and one or a plurality of strip-shaped concave portions extending in an extending direction of the current injection region, the concave portions disposed in a central part in a width direction of the current injection region.

In the third laser diode according to another embodiment of the present invention, the current confinement structure includes the pair of high resistance regions with the current injection region in between, and one or a plurality of strip-shaped concave portions extending in the extending direction of the current injection region, the concave portions disposed in the central part in the width direction of the current injection region. Thereby, light emitted in the active layer is guided by a waveguide structure corresponding to a refractive index distribution formed by the current confinement structure and the concave portion.

According to another embodiment of the present invention, there is provided a fourth laser diode having an active layer, and a stacked structure including one or a plurality of strip-shaped current confinement structures confining a current which is injected into the active layer. The current confinement structure is in a ridge shape, and the current confinement structure includes a contact layer having a width smaller than the width of an upper part of the current confinement structure, the contact layer disposed in an upper part of the ridge shape.

In the fourth laser diode according to another embodiment of the present invention, the contact layer having the width smaller than the width of the upper part of the current confinement structure is provided in the upper part of the current confinement structure in the ridge shape. Thereby, light emitted in the active layer is guided by a waveguide structure corresponding to a refractive index distribution formed by the current confinement structure and the distribution of the injection current via the contact layer.

A method of manufacturing a laser diode according to an embodiment of the present invention includes steps of (A), (B), and (C) as follows. The steps are:
(A) forming one or a plurality of strip-shaped concave portions on a surface of a semiconductor substrate,
(B) forming a first conductive semiconductor layer, an active layer, and a second conductive semiconductor layer in this order on the surface of the semiconductor substrate on the concave portion side, the semiconductor substrate on which the concave portion is formed, thereby forming a strip shaped convex portion in an area corresponding to the concave portion in the first conductive semiconductor layer on the active layer side, and (C) forming a current confinement structure confining a current which is injected into the active layer, on an upper part of the second conductive semiconductor layer, the current confinement structure extending in an extending direction of the concave portion.

In the method of manufacturing the laser diode according to an embodiment of the present invention, one or a plurality of strip-shaped convex portions extending in the extending direction of the current confinement structure are formed in the first conductive semiconductor layer by using the concave portion formed on the surface of the semiconductor substrate. Thereby, light emitted in the active layer is guided by a waveguide structure corresponding to a refractive index distribution formed by the current confinement structure and the convex portions.

According to the first laser diode and the second laser diode, and a method of manufacturing a laser diode in embodiments of the present invention, the light emitted in the active layer is guided by the waveguide structure corresponding to the refractive index distribution formed by the current confinement structure and the convex portion. Thus, due to the interaction of the waveguide structure by both of the current confinement structure and the convex portion, a transverse mode is stabled and filament emission may be suppressed. Thereby, NFP with a stable and uniform shape may be formed.

According to the third laser diode in an embodiment of the present invention, the light emitted in the active layer is guided by the waveguide structure corresponding to the refractive index distribution formed by the current confinement structure and the concave portion. Thus, due to the interaction of the waveguide structure by both of the current confinement structure and the concave portion, a transverse mode is stabled and filament emission may be suppressed. Thereby, NPF with a stable and uniform shape may be formed.

According to the fourth laser diode in an embodiment of the present invention, the light emitted in the active layer is guided by the waveguide structure corresponding to the refractive index distribution formed by the current confinement structure and the distribution of the injection current via the contact layer. Thus, due to the interaction of the waveguide structure by both of the current confinement structure and the distribution of the injection current via the contact layer, a transverse mode is stabled and filament emission may be suppressed. Thereby, NPF with a stable and uniform shape may be formed.

Other and further objects, features and advantages of the invention will appear more fully from the following description.

BRIEF DESCRIPTION OF THE DRAWINGS

FIGS. 4A and 4B are cross sectional configuration views of a modification of the laser diode of FIGS. 1A and 1B.

FIGS. 16A and 16B are cross-sectional configuration views of a modification of the laser diode of FIGS. 13A and 13B.

DETAILED DESCRIPTION OF THE PREFERRED EMBODIMENTS

Preferred embodiments of the present invention will be described in detail with reference to the accompanying drawings.

First Embodiment

Figure 1:
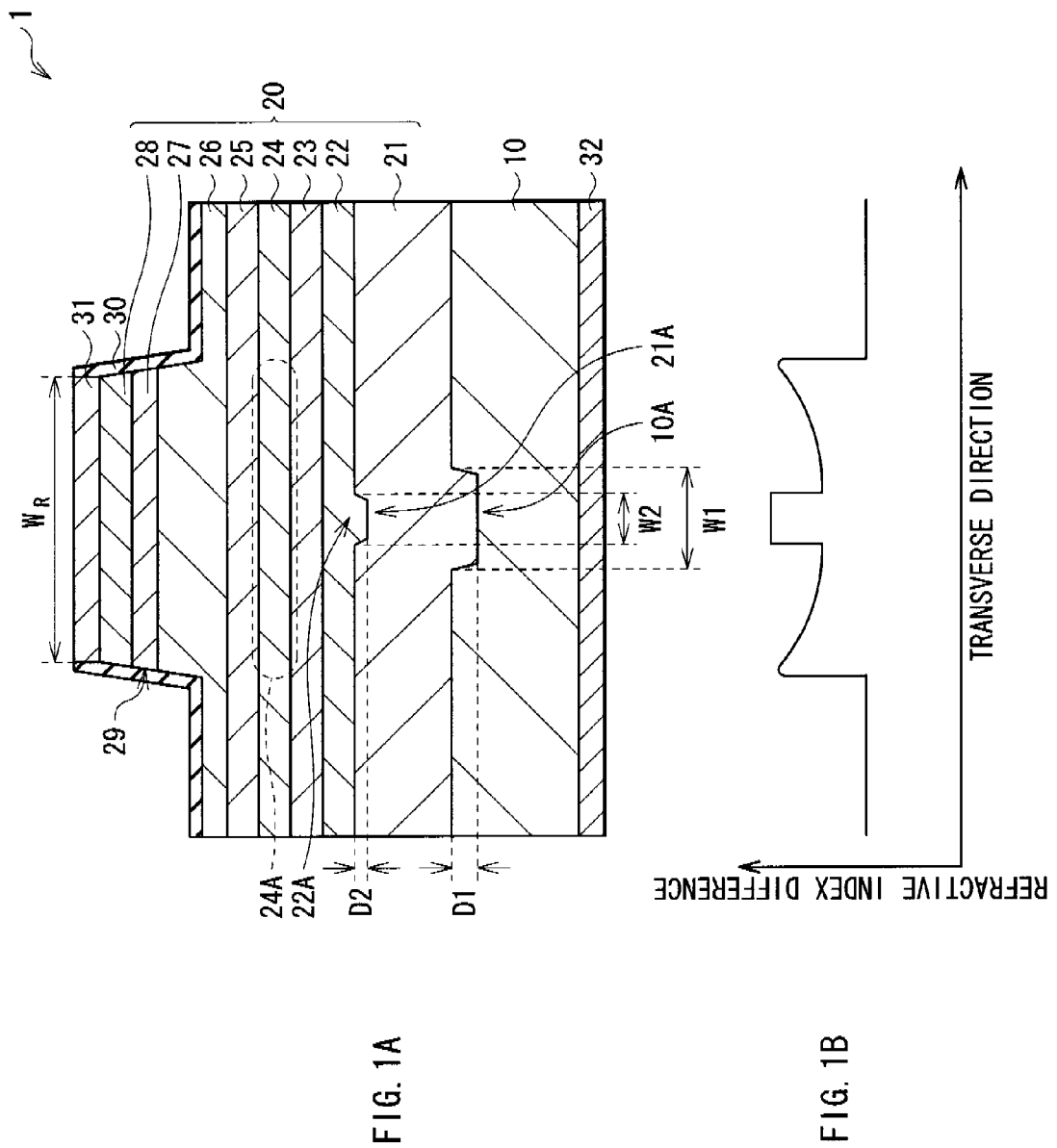
FIGS. 1A and 1B are examples of a cross-sectional configuration view of a laser diode according of a first embodiment of the present invention.
Figure 2:
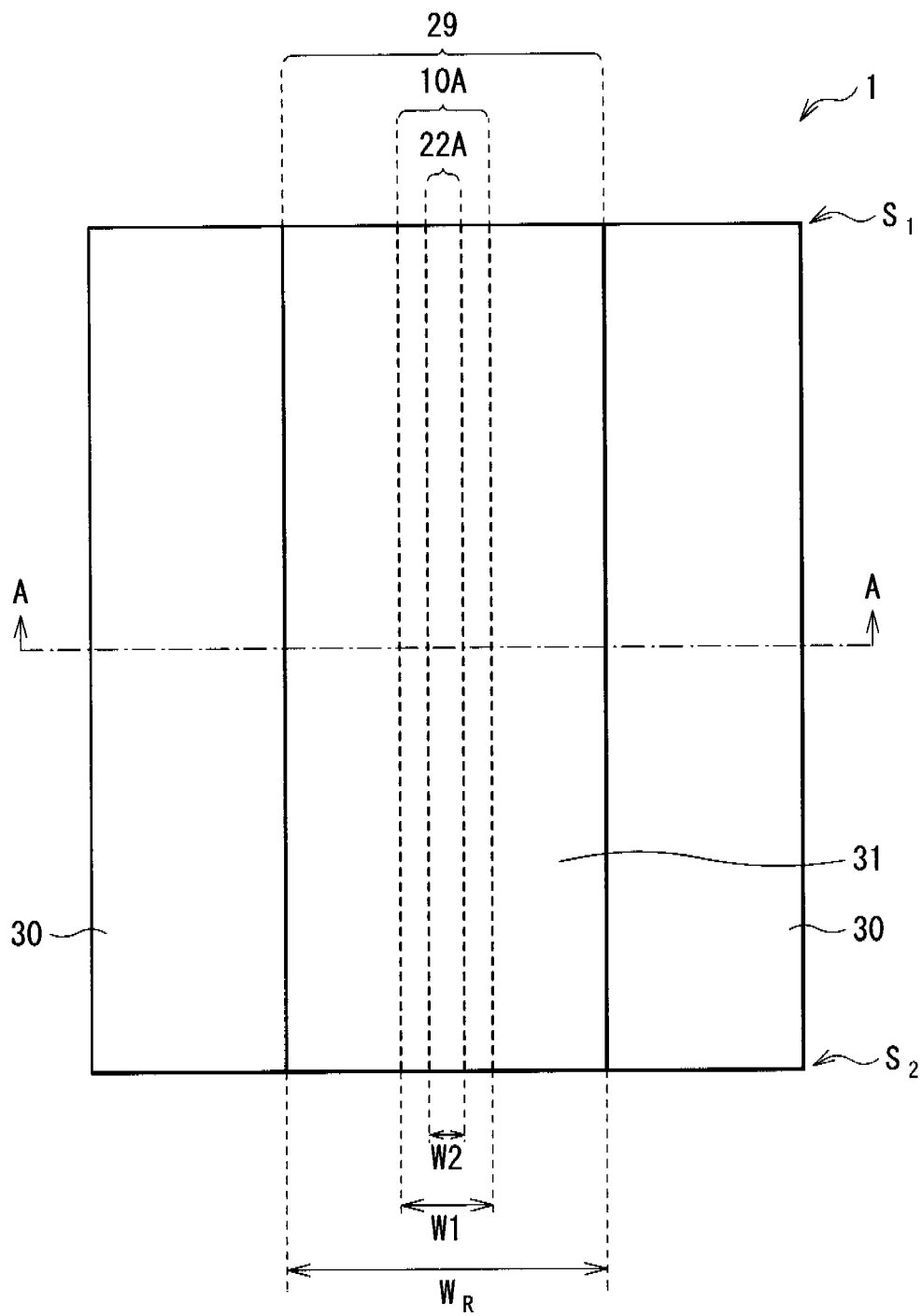
FIG. 2 is an example of a top surface configuration view of the laser diode of FIGS. 1A and 1B

FIG. 1A illustrates a cross-sectional configuration of a laser diode 1 according to a first embodiment of the present invention. FIG. 1B shows a refractive index distribution of the laser diode 1 of FIG. 1A. FIG. 2 illustrates an example of a top surface configuration of the laser diode 1 of FIG. 1A. In addition, FIG. 1A corresponds to a cross-sectional configuration view taken along the direction of an arrow A-A in FIG. 2. The laser diode 1 is an index guided laser including a semiconductor substrate 10, a semiconductor layer 20 formed on the semiconductor substrate 10 (stacked structure), and a ridge 29 formed in an upper part of the semiconductor layer 20 (current confinement structure). The laser diode 1 is also a broad-area laser in which a width $W_R$ of the ridge 29 is wide (at least 5 μm or above).

The semiconductor layer 20 has a configuration in which a lower cladding layer 21, a first lower guide layer 22, a second lower guide layer 23, an active layer 24, an upper guide layer 25, an upper cladding layer 26, an intermediate layer 27, and a contact layer 28 are stacked in this order from the semiconductor substrate 10 side. The ridge 29 is provided in the upper part of the semiconductor layer 20. Specifically, the ridge 29 is provided in the upper part of the upper cladding layer 26, and in the intermediate layer 27 and the contact layer 28, and has a stripe convex shape extending in an emitting direction (axis direction) of a laser light. Hereafter, the direction of the stacked layers constituting the semiconductor layer 20 is referred to as a vertical direction, and the direction perpendicular to the axis direction and the vertical direction is referred to as a transverse direction.

The semiconductor substrate 10 is, for example, composed of n-type GaAs, and is a patterned substrate having a concave portion 10A on its surface on the semiconductor layer 20 side. In addition, the n-type impurities are, for example, silicon (Si) and selenium (Se).

Figure 3:
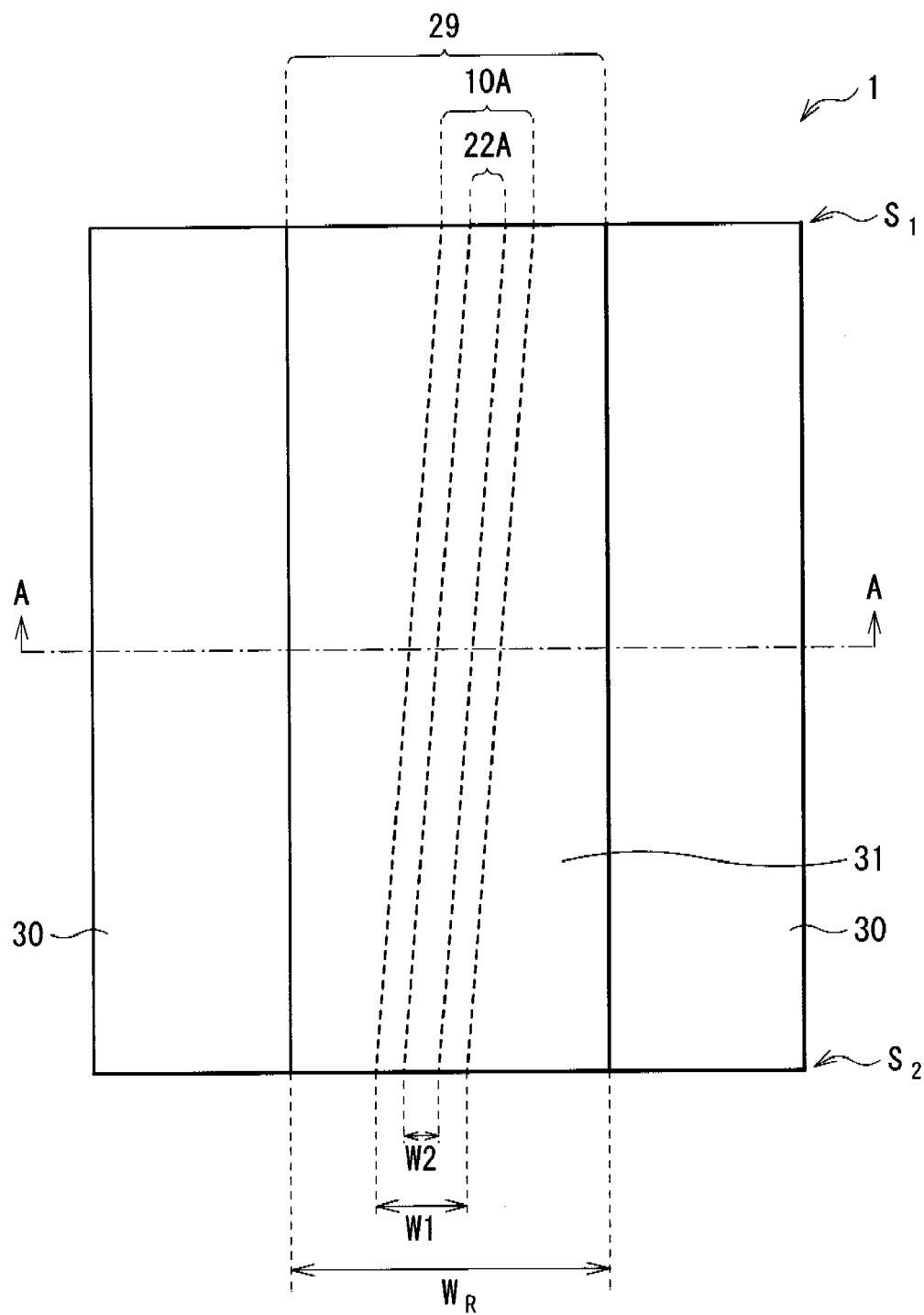
FIG. 3 is another example of the top surface configuration view of the laser diode of FIGS. 1A and 1B.

In an area corresponding to the ridge 29 (facing area), the concave portion 10A extends in the extending direction of the ridge 29. When the lower cladding layer 21, the first lower guide layer 22, the second lower guide layer 23, and the active layer 24 are formed in this order on the semiconductor substrate 10 through the use of the crystal growth method in a manufacturing step (will be described later), the concave portion 10A preferably has a depth and a width which are large to the extent that the active layer 24 is formed in a flat plane without concave and convex. The concave portion 10 preferably has a depth $D_1$ from 100 nm to 200 nm and a width $W_1$ (width of the top of the aperture) from 5 μm to 10 μm. Also, as shown in FIG. 2, the concave portion 10A preferably extends in the direction parallel to the extending direction (axis direction) of the ridge 29. Alternatively, as shown in FIG. 3, in the area facing the ridge 29, the concave portion 10A may extend in the direction intersecting the extending direction (axis direction) of the ridge 29. As shown in FIG. 2, the concave portion 10A is preferably formed in the area facing the central part in a width direction (transverse direction) of the ridge 29. Alternatively, the concave portion 10A may be formed in the area except the area facing the central part in the width direction (transverse direction) of the ridge 29.

The lower cladding layer 21 is, for example, composed of n-type AlInP, and has a strip-shaped concave portion 21A which has a depth smaller than the depth $D_1$ of the concave portion 10A, and a width smaller than the width $W_1$ of the concave portion 10A, in the area corresponding to the concave portion 10A of the semiconductor substrate 10. Due to the rib structure constructed by the concave portion 21A and a convex portion 22A (will be described later), the concave portion 21A has a depth $D_2$ and a width $W_2$ which produce a change on an effective refractive index distribution in the transverse direction by the ridge 29. The depth $D_2$ is preferably from 50 nm to 100 nm and the width $W_2$ (width of the top of the aperture) is preferably from 5 μm to 10 μm.

When a semiconductor material is crystal-grown on the semiconductor substrate 10 in a manufacturing step (will be described later), the concave portion 21A is formed under the influence of the concave portion 10A. Thus, the depth $D_2$ and the width $W_2$ of the concave portion 21A may be set within a desired range by adjusting the thickness of the lower cladding layer 21, or adjusting the depth $D_1$ and the width $W_1$ of the concave portion 10A. In addition, in the case where the concave portion 10A is set so as to have the depth $D_1$ from 100 nm to 200 nm, and the width $W_1$ from 5 μm to 10 μm, the lower cladding layer 21 may have a thickness as the same size as that in the case of the related art in which the semiconductor substrate 10 includes no concave portion 10A.

As described above, because the concave portion 21A is formed under the influence of the concave portion 10A, the concave portion 21A extends in the direction parallel to the extending direction of the concave portion 10A. Thus, as shown in FIG. 2, in the case where the concave portion 10A is formed in the area facing the central part in the width direction of the ridge 29, the concave portion 21A is also formed in the area facing the central part in the width direction of the ridge 29. As shown in FIG. 3, in the area facing the ridge 29, in the case where the concave portion 10A extends in the direction intersecting the extending direction of the ridge 29, the concave portion 21A also extends in the direction intersecting the extending direction of the ridge 29.

The first lower guide layer 22 is, for example, composed of n-type AlGaInP, and has a strip-shaped convex portion 22A which has a height larger than the depth $D_1$ of the concave portion 10A, and a width smaller than the width $W_1$ of the concave portion 10A, in the area corresponding to the concave portion 10A of the semiconductor substrate 10. The convex portion 22A is formed so as to fill the concave portion 21A of the lower cladding layer 21. Thus, the convex portion 22A has a convex shape projecting to the semiconductor substrate 10 side (side opposite from the active layer 24), and extends in the direction parallel to the extending direction of the concave portion 10A. Due to the rib structure constructed by the concave portion 21A and the convex portion 22A, the convex portion 22A has the height (the depth $D_2$) and the width (the width $W_2$) which produce a change on the effective refractive index distribution in the transverse direction by the ridge 29. The height is preferably from 50 nm to 100 nm and the width (width of the bottom of the convex) is preferably from 5 μm to 10 μm. In the rib structure, the difference (refractive index difference) between the refractive index on the lower cladding layer 21 side and the refractive index on the first lower guide layer 22 side is preferably 0.1 or above.

The second lower guide layer 23 is, for example, composed of n-type AlGaInP, and is formed in an almost-flat shape without concave and convex, even in the position immediately above the convex portion 22A.

The active layer 24 is, for example, composed of undoped GaInP, and is formed on the flat second lower guide layer 23 in a manufacturing step (will be described later). Thus, the active layer 24 is also formed in an almost-flat shape without concave and convex. In the active layer 24, the area facing the ridge 29 is a light emitting region 24A. The light emitting region 24A has a stripe width as the same size as that of the bottom (the portion of the upper cladding layer 26) of the ridge 29 facing the light emitting region 24A. The light emitting region 24A is coincident with a current injection region into which the current confined in the ridge 29 is injected.

The upper guide layer 25 is, for example, composed of p-type AlGaInP. Similarly to the active layer 24, the upper guide layer 25 is formed in an almost-flat shape without concave and convex. In addition, the p-type impurities are, for example, zinc (Zn), magnesium (Mg), and beryllium (Be).

The upper cladding layer 26 is, for example, composed of p-type AlInP. The intermediate layer 27 is, for example, composed of p-type GaInP. The contact layer 28 is, for example, composed of p-type GaAs. As described above, the ridge 29 is constructed by the upper part of the upper cladding layer 26, and the intermediate layer 27 and the contact layer 28. The contact layer 28 is formed over the whole upper surface of the ridge 29.

In the laser diode 1, an upper electrode layer 31 is formed on the upper surface of the ridge 29 (contact layer 28). An insulating layer 30 is formed over the side faces of the ridge 29, and the surface of the upper cladding layer 26 except the area the ridge 29 is formed. In addition, the upper electrode layer 31 may extend up to the surface of the insulating layer 30. A lower electrode layer 32 is formed on a rear surface (the surface opposite from the semiconductor layer 20 side) of the semiconductor substrate 10.

The insulating layer 30 is, for example, composed of silicon oxide ($SiO_2$). The upper electrode layer 31 is, for example, formed by stacking titanium (Ti), platinum (Pt), and gold (Au) in this order on the contact layer 28, and is electrically connected to the contact layer 28. The lower electrode layer 32 has, for example, a configuration formed by stacking alloy of gold (Au) and germanium (Ge), nickel (Ni), and gold (Au) in this order from the semiconductor substrate 10 side, and is electrically connected to the semiconductor substrate 10.

The laser diode 1 having such a configuration may, for example, be manufactured as will be described below.

First, the strip-shaped concave portion 10A having predetermined width and depth is formed on the surface of the semiconductor substrate 10. Next, through the use of the crystal growth method, on the surface of the semiconductor substrate 10 on the concave portion 10A side, the lower cladding layer 21, the first lower guide layer 22, the second lower guide layer 23, the active layer 24, the upper guide layer 25, the upper cladding layer 26, the intermediate layer 27, and the contact layer 28 are stacked in this order from the semiconductor substrate 10 side. Thereby, in the first lower guide layer 22 immediately below the active layer 24, the strip-shaped convex portion 22A is formed in the area (facing area) corresponding to the convex portion 10A, and the active layer 24 is formed on the flat second lower guide layer 23. Next, for example through the use of the dry etching method, the upper part of the upper cladding layer 26, and the intermediate layer 27 and the contact layer 28 are selectively etched. Thereby, the ridge 29 is formed in the upper part of the semiconductor layer 20. After that, the insulating layer 30, the upper electrode layer 31, and the lower electrode layer 32 are formed, and then a front end face $S_1$ and a rear end face $S_2$ are formed by cleaving the semiconductor substrate 10 in the direction orthogonal to the extending direction of the ridge 29. In this manner, the laser diode 1 according to the first embodiment is manufactured.

Next, the operation of the laser diode 1 according to the first embodiment will be described. In the laser diode 1, when a predetermined amount of voltage is applied between the lower electrode layer 32 and the upper electrode layer 31, the current is confined by the ridge 29 and the current is injected into the current injection region (light emitting region 24A) of the active layer 24. Thereby, an electron and a hole are recombined so that light emission is generated. This light is guided in the semiconductor layer 20 by a waveguide structure corresponding to the refractive index distribution formed by the ridge 29 and the convex portion 22A. The light is also reflected by a pair of cleavage planes (the front end face $S_1$ and the rear end face $S_2$) (refer to FIG. 2) facing each other in the extending direction (axis direction) of the ridge 29. While the light moves back and forth between the pair of cleavage planes, a laser oscillation is generated at a predetermined wavelength, and thereby a laser beam is emitted outside from the cleavage planes.

Figure 25A:
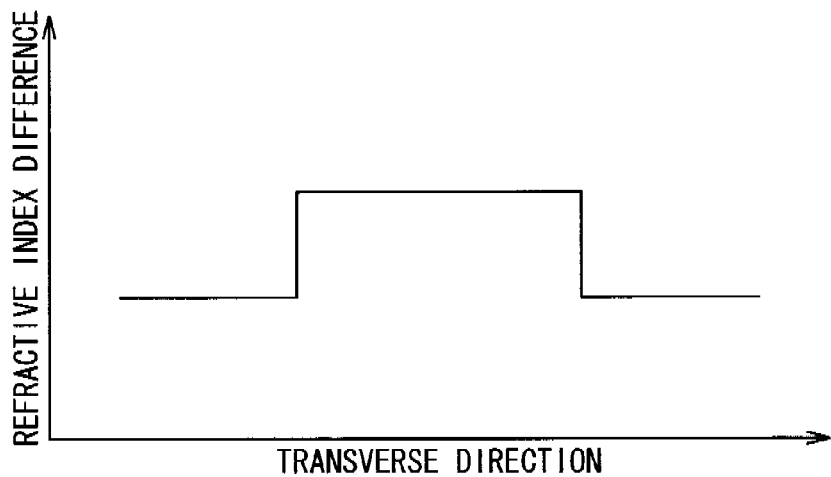
FIGS. 25A and 25B are examples of a refractive index distribution of a laser diode of the related art.
Figure 25B:
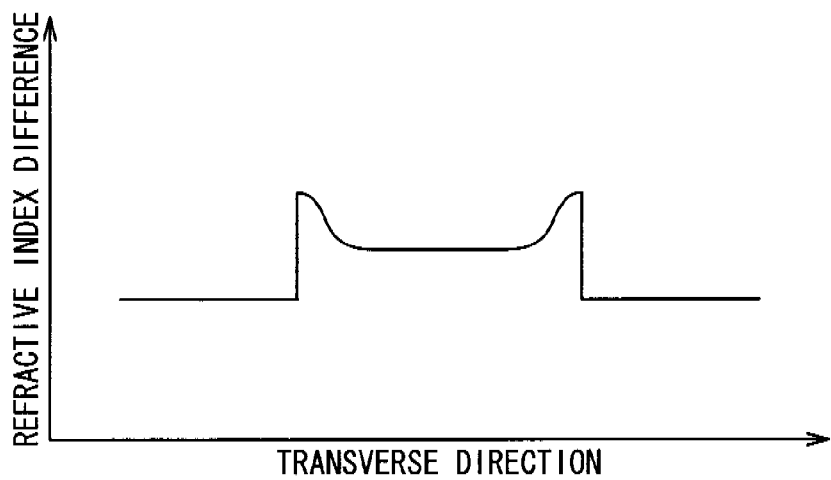

In a typical laser diode including the ridge structure, due to the refractive index difference in the transverse direction by the ridge structure, the light emitted in the light emitting region of the active layer is confined from the transverse direction in a light waveguide. At this time, in the case of the narrow-stripe laser diode in which the ridge width is narrow (less than 5 μm), the refractive index distribution in the transverse direction becomes the index guide type (refer to FIG. 25A). However, in the case of the broad-area laser diode in which the ridge width is wide, because of the plasma effect caused by the current injected into the light emitting region, the refractive index in the central part of the refractive index distribution in the transverse direction formed by the ridge structure decreases, and the central part of the refractive index distribution curves downwards as shown in FIG. 25B. Thus, in this case, the refractive index distribution in the transverse direction is not the index guide type in the whole region. That is, in the central part, it is the gain guide type which may be expressed as the anti-guide type. In this way, in the case where the waveguide structure is the waveguide type (broad-area waveguide type) which is the index guide type in combination with the gain guide type in the central part, NFP is defined by the cooperative interaction of the transverse mode formed by the index mode at both ends and the gain mode in the central part. Therefore, it is important that the overall mode is smoothly established while both of the modes are appropriately accorded (refer to T. Asatsuma et al., Proceedings of SPIE, Vol. 61040C (2006)).

For example, there are known measures in which the refractive index difference at both ends in the transverse direction of the ridge structure is set within the predetermined range (for example, approximately 0.005), and thereby the NFP approaches the top hat shape. However, in the measures, it is difficult to sufficiently control the gain region in the large central part, and thus the transverse mode may be changed due to a change in injection current and temperature (refer to D. Imanishi et al., Electronics Letters, 41 (2005) p 1172).

On the other hand, in the first embodiment, the strip-shaped convex portion 22A extending in the extending direction of the ridge 29 is provided in a light waveguide region (the second lower guide layer 23) of the semiconductor layer 20. Thereby, as shown in FIG. 1B, because a narrow-stripe index guide formed by the convex portion 22A is applied in the gain region in the large central part, when the index guided transverse mode is generated by the convex portion 22A, the transverse mode is induced in the gain region. Then, the transverse mode generated in the index region in the central part formed by the convex portion 22A is combined with the transverse mode induced in the gain region so that the index guide in the central part controls the transverse mode induced in the gain region. When the transverse mode is generated in the index region at both ends, the transverse mode in the index region is combined with the transverse mode in the gain region so that the index guide at both ends controls the width of the entire NFP to be within the predetermined range. In this manner, the transverse mode generated in the index region corresponding to the convex portion 22A, the transverse mode generated in the gain region, and the transverse mode generated in the index region at both ends are cooperatively combined with each other. Thereby, the transverse mode generated in the gain region loses controllability and becomes easy to be controlled. As a result, the NFP with the stable and uniform shape may be formed as a whole.

As shown in FIG. 2, in the case where the convex portion 22A is formed in the area facing the central part in the width direction (transverse direction) of the ridge 29, the stripe in an index guide induction mode, and the stripe in an gain guide induction mode are parallel to each other so that there is an advantage that these modes are likely and smoothly combined. As shown in FIG. 3, in the area facing the ridge 29, in the case where the convex portion 22A extends in the direction intersecting the extending direction (axis direction) of the ridge 29, formation of a peak of a certain spatial periodicity is suppressed within the whole transverse mode, and thus the top-hat shape is easily formed as a whole since various modes are excited at the same time.

Modification of First Embodiment

In the first embodiment, although only one convex portion 22A (the concave portion 21A and the concave portion 10A) is formed, two convex portions 22A may be formed in the central part, for example, as shown in FIG. 4A or three or more convex portions 22A may be formed. In the case where the two convex portions 22A (the concave portions 21A and the concave portions 10A) are formed in the central part, the refractive index distribution is, for example, as shown in FIG. 4B.

In the first embodiment, although the convex portion 22A is projected to the semiconductor substrate 10 side, the convex portion, instead of the concave portion 10A, may be provided on the semiconductor substrate 10, and the concave portion may be provided corresponding to the convex portion, on the interface of the first lower guide layer 22 on the semiconductor substrate 10 side. In this case, on the interface of the lower cladding layer 21 on the first lower guide layer 22 side, the convex portion which is projected to the active layer 24 side may be formed corresponding to the concave portion of the first lower guide layer 22.

Second Embodiment

Figure 5A:
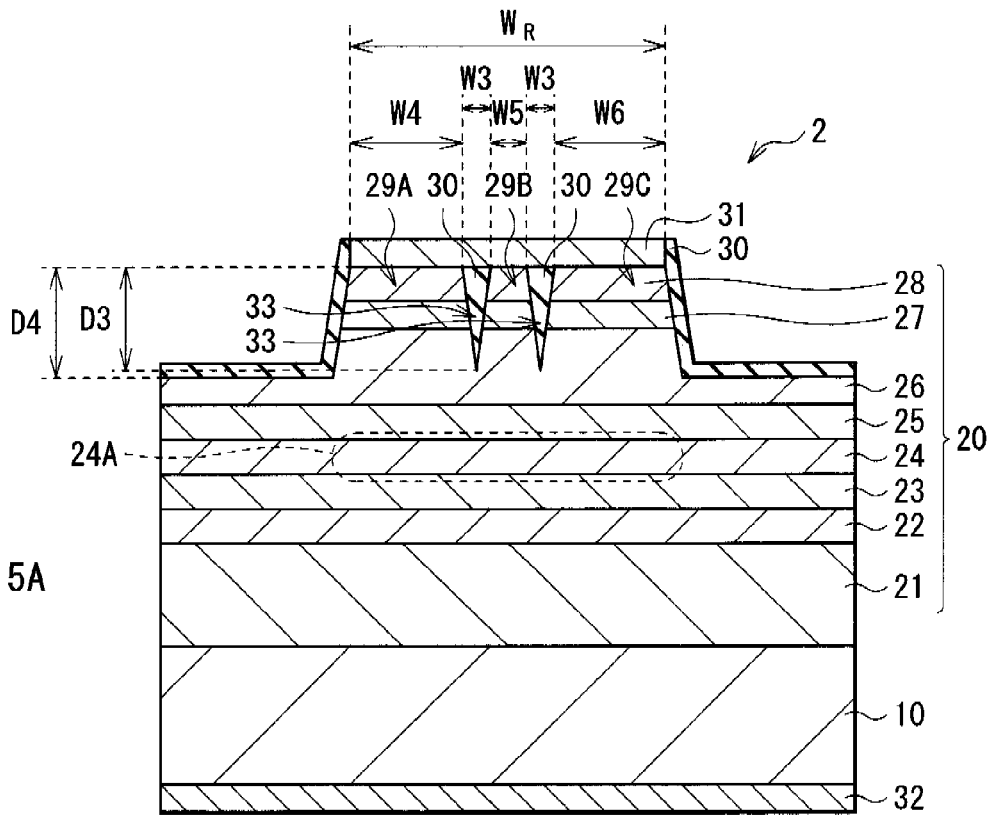
FIGS. 5A and 5B are examples of a cross-sectional configuration view of a laser diode according to a second embodiment of the present invention.
Figure 5B:
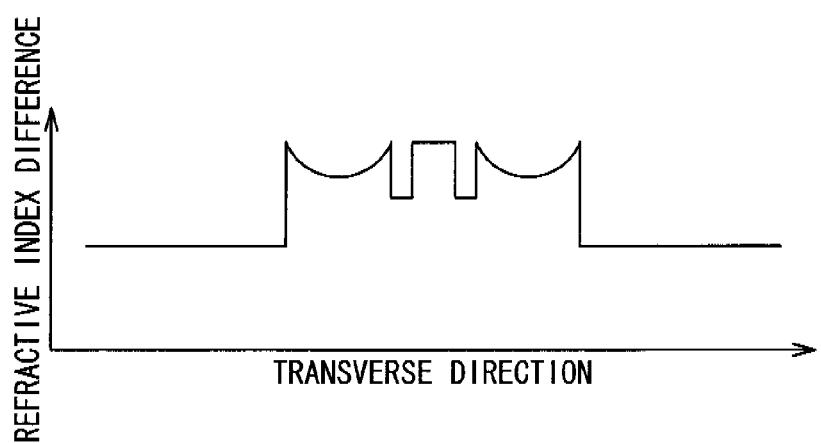
Figure 6:
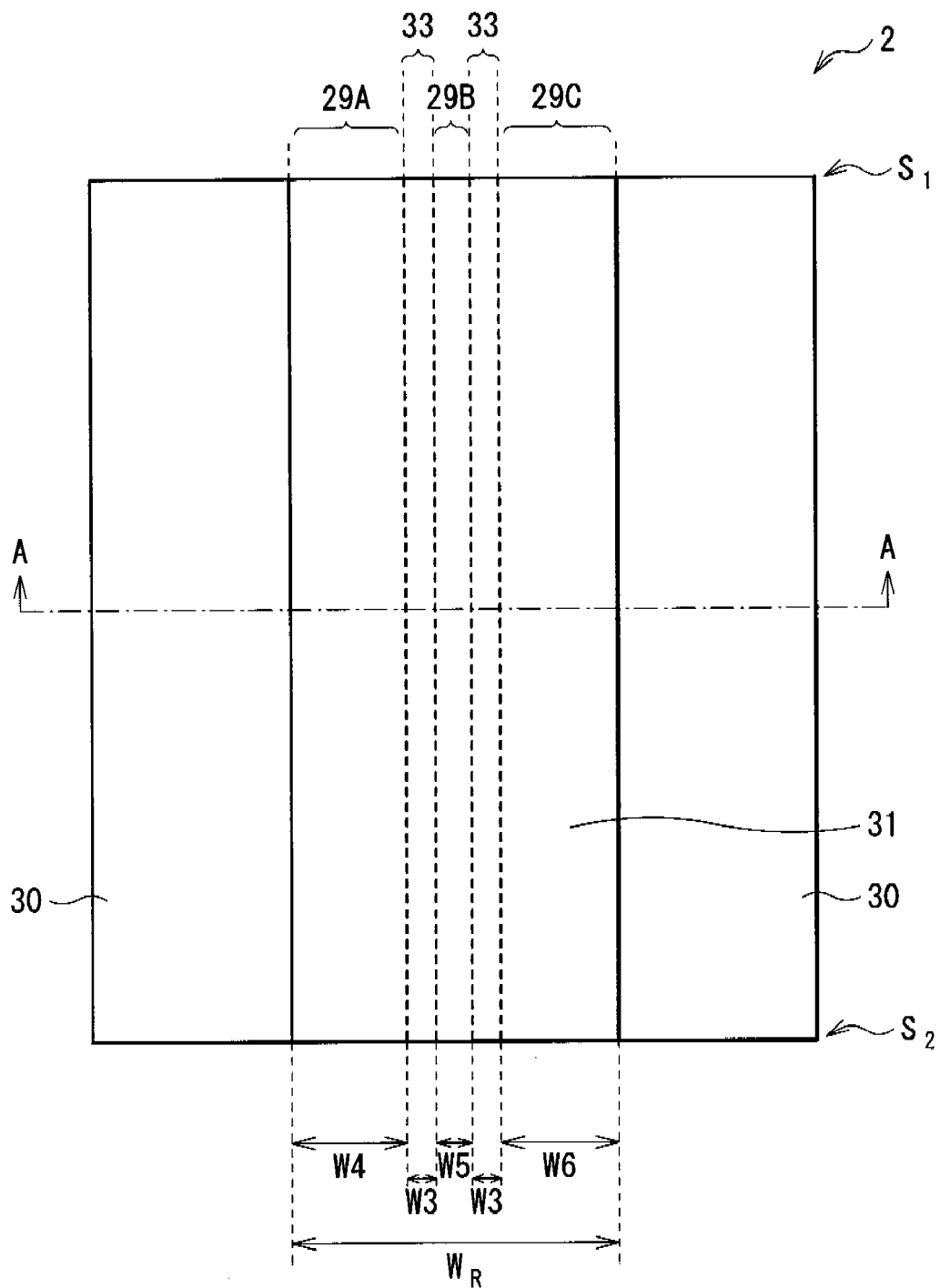
FIG. 6 is an example of a top surface configuration view of the laser diode of FIGS. 5A and 5B.

FIG. 5A illustrates an example of the cross-sectional configuration of a laser diode 2 according to a second embodiment of the present invention. FIG. 5B shows the refractive index distribution of the laser diode 2 of FIG. 5A. FIG. 6 shows an example of a top surface configuration of the laser diode 2 of FIG. 5A. In addition, FIG. 5A corresponds to the cross-sectional configuration view as viewed from the direction of an arrow A-A of FIG. 6. Similarly to the first embodiment, the laser diode 2 is an index guided laser including a semiconductor substrate 10, a semiconductor layer 20 (stacked structure) formed on the semiconductor substrate 10, and a ridge 29 (current confinement structure) formed in the upper part of the semiconductor layer 20. The laser diode 2 is also a broad-area laser in which a width $W_R$ of the ridge 29 is wide (at least 5 μm or above).

The laser diode 2 has a configuration different from that of the first embodiment in that a pair of concave portions 33 are provided in the ridge 29, instead of providing the convex portion 22A, the concave portion 21A and the concave portion 10A. Thus, hereafter, the difference from the first embodiment will be described in detail, and the description common to the first embodiment will be appropriately omitted.

In the second embodiment, as described above, the pair of concave portions 33 are formed in the ridge 29, and an upper part of the ridge 29 is separated into three portions. Hereafter, in the separated three portions, the portions located at both ends in the width direction of the ridge 29 are referred to as a ridge portion 29A and a ridge portion 29C, and the portion sandwiched between the ridge portions 29A and 29C are referred to as a ridge portion 29B.

The concave portions 33 are grooves reaching a predetermined depth from the upper surface of the ridge 29. The concave portions 33 extend in the extending direction of the ridge 29. Thus, the ridge portions 29A, 29B, and 29C also extend in the extending direction of the ridge 29. A depth $D_3$ of the concave portion 33 and a width $W_3$ in the transverse direction of the concave portion 33 may be arbitrarily set, as long as the depth $D_3$ and the width $W_3$ are within the range so that the ridge portions 29A, 29B, and 29C form a waveguide structure as a whole. For example, the depth $D_3$ is preferably equal to or smaller than a height $D_4$ of the ridge 29. The width $W_3$ is preferably from 2 μm to 5 μm.

Figure 7:
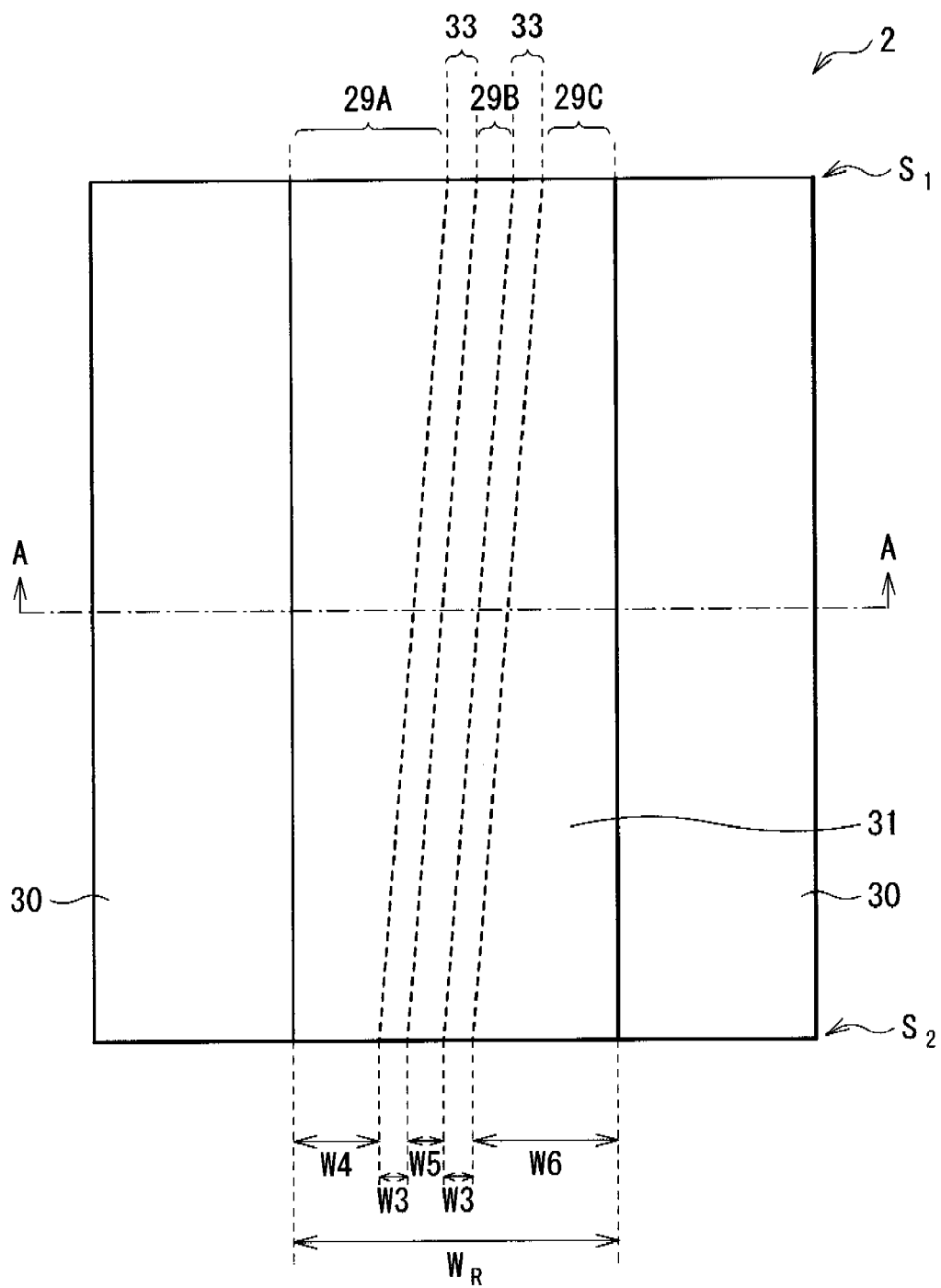
FIG. 7 is another example of the top surface configuration view of the laser diode of FIGS. 5A and 5B.
Figures 8A, 8B:
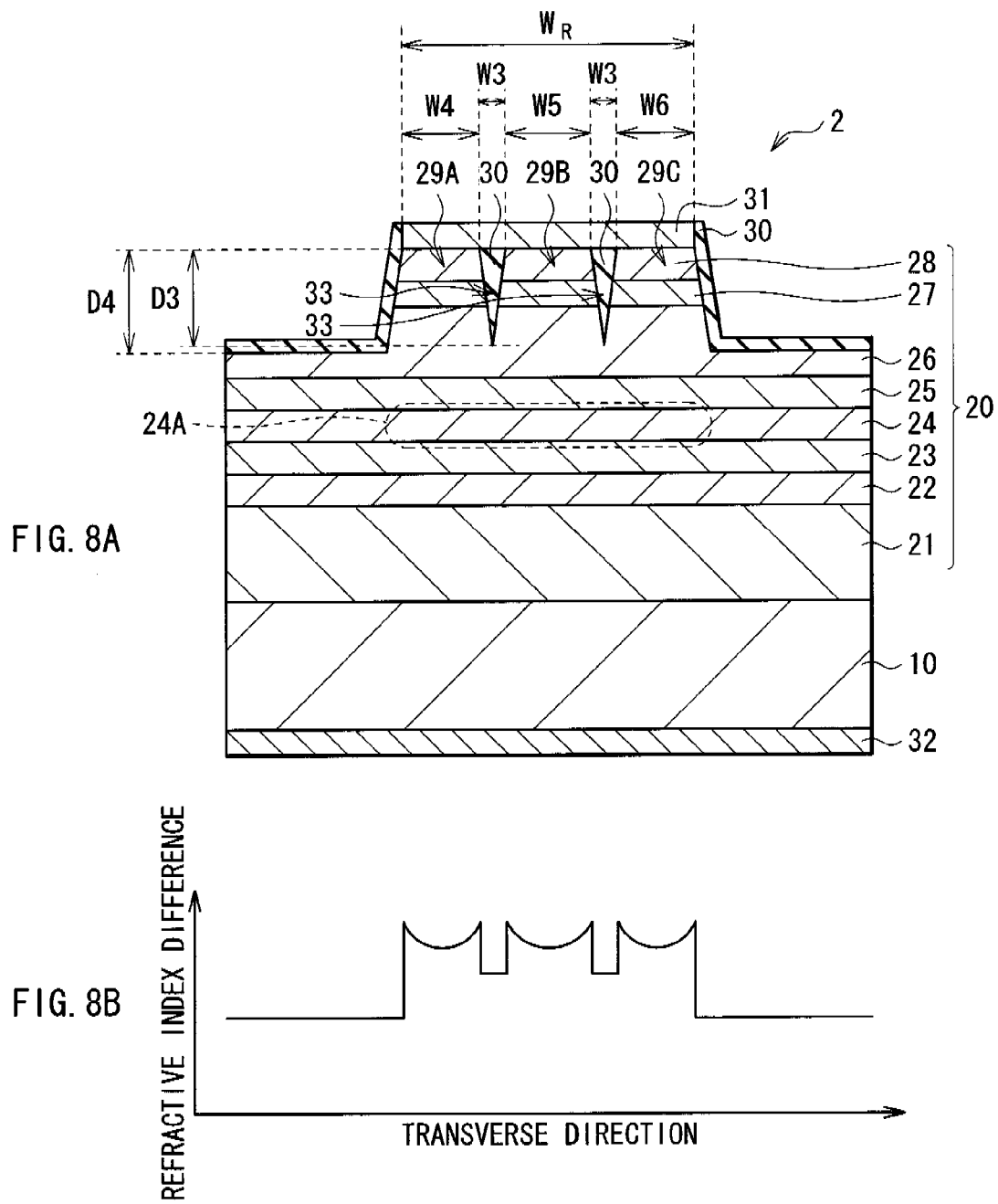
FIGS. 8A and 8B are cross-sectional configuration views of a modification of the laser diode of FIGS. 5A and 5B.
Figures 9A, 9B:
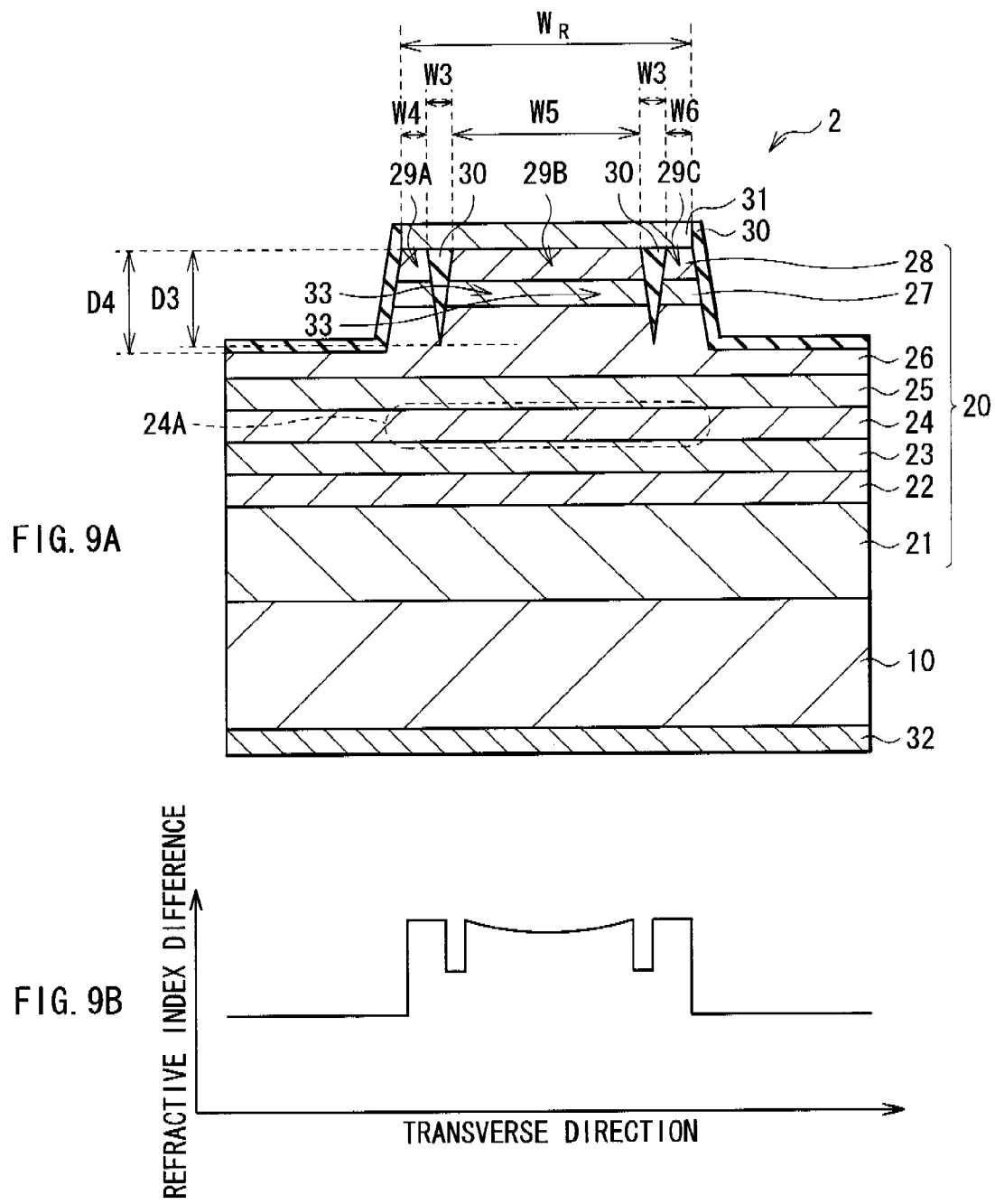
FIGS. 9A and 9B are cross-sectional configuration views of another modification of the laser diode of FIGS. 5A and 5B.

As shown in FIGS. 5A and 6, the concave portions 33 preferably extend in the direction parallel to the extending direction of the ridge 29. Alternatively, as shown in FIG. 7, the concave portions 33 may extend in the direction intersecting the extending direction of the ridge 29. As shown in FIG. 5A, the concave portions 33 may be formed in the central part in the width direction of the ridge 29. Alternatively, the concave portions 33 may be formed in the area except the central part in the width direction of the ridge 29. For example, as shown in FIG. 8A, the concave portions 33 may be formed in the positions where the ridge 29 is equally separated into three portions in the width direction. Alternatively, for example, as shown in FIG. 9A, the concave portions 33 may also be formed in the vicinity of both ends in the width direction of the ridge 29. FIG. 8B and FIG. 9B show the refractive index distributions of the laser diodes of FIG. 8A and FIG. 9A, respectively.

The ridge 29 is separated into the ridge portion 29A, 29B, and 29C by the concave portions 33, and a confined current is injected into the active layer 24 from the ridge portions 29A, 29B, and 29C. An upper electrode layer 31 is provided on upper surfaces of the ridge portions 29A, 29B, and 29C, and the upper surfaces of the ridge portions 29A, 29B, and 29C are electrically connected via the upper electrode layer 31. Thus, it may be said that, as a circuit, the ridge portions 29A, 29B, and 29C are connected in parallel between the upper electrode layer 31 and the lower electrode layer 32. However, as exemplified above, because the ridge 29 is separated into the ridge portions 29A, 29B, and 29C only by the concave portions 33 with the small depth $D_3$ and the small width $W_3$, the current injection regions of the ridge portions 29A, 29B, and 29C are partially overlapped with each other. As a result, one light emitting region 24A is constituted. Therefore, the ridge portions 29A, 29B, and 29C form a waveguide structure as a whole in the semiconductor layer 20.

For example, as shown in FIG. 5A, in the case where the concave portions 33 are formed in the central part in the width direction of the ridge 29, a width $W_5$ of the ridge portion 29B formed in the central part of the ridge 29 is a with (less than 5 μm) as the same size as the stripe width of the narrow-stripe laser diode, and a width $W_4$ and a width $W_6$ of the ridge portions 29A and 29C formed in the area except the central part of the ridge 29 are widths (at least 5 μm or above) as the same size as the stripe width of the broad-area laser diode. Thereby, as shown in FIG. 5B, in the center of the broad-area waveguide of a width $W_R$ formed between the outer end of the ridge portion 29A and the outer end of the ridge portion 29C, applied is a narrow-stripe index guide formed by the ridge portion 29B. Thus, the transverse mode generated in the index region in the central part formed by the ridge portion 29B is combined with the transverse mode generated in the gain region included in the broad-area waveguide of the width $W_R$ so that the index guide in the central part controls the transverse mode generated in the gain region. When the transverse mode is generated in the index region at both ends, the transverse mode in the index region is combined with the transverse mode in the gain region, and thus the index guide at both ends controls the width of the entire NFP to be within the predetermined range. In this manner, the transverse modes generated in the ridge portions 29A, 29B, and 29C are cooperatively combined with each other. Thereby, the transverse mode generated in the gain region loses controllability and becomes easy to be controlled. As a result, the NFP with the stable and uniform shape may be formed as a whole.

For example, as shown in FIG. 8A, in the case where the concave portions 33 are formed in positions where the ridge 29 is equally separated into the three portions in the width direction, the widths $W_4$, $W_5$, and $W_6$ of the equally-separated ridge portions 29A, 29B, and 29C become widths (approximately from 10 μm to 30 μm) as the same size as the stripe width of the broad-area laser diode having a relatively small width. Thereby, as shown in FIG. 8B, the broad-area index guide which has a relatively small width is formed corresponding to each of the ridge portions 29A, 29B, and 29C. Thus, the transverse modes formed by the ridge portions 29A, 29B, and 29C are combined with each other, and the NFP with the stable and uniform shape may be formed as a whole.

In addition, as described above, the widths $W_4$, $W_5$, and $W_6$ of the ridge portions 29A, 29B, and 29C, respectively, may be disposed with unequal intervals in between. For example, the ridge portion 29B may be formed with a relatively small width and a plurality of pitches of the transverse mode are applied. Thus, by the interferences (beat cycle) of these modes, the NFP with the stable and uniform shape may be formed as a whole.

For example, as shown in FIG. 9A, in the case where the concave portions 33 are formed in the vicinity of both ends in the width direction of the ridge 29, the width $W_5$ of the ridge portion 29B formed in the central part of the ridge 29 becomes the width (at least 5 μm or above) as the same size as the stripe width of the broad-area laser diode, and the widths $W_4$ and $W_6$ of the ridge portions 29A and 29C formed in the area except the central part of the ridge 29 become the widths (less than 5 μm) as the same size as the stripe width of the narrow-stripe laser diode.

Here, in the typical broad-area laser diode including the index guide structure by the ridge, the transverse mode in the index region at both ends in the width direction of the ridge tends to oscillate prior to the transverse mode in the gain region in the central part, and it is likely that, in the beginning of the oscillation (when the amount of the injection current is still small), a double-angle mode in which the transverse mode at both ends of the index guide region is prioritized is applied. Also, in the case where the index guide structure is formed by the single ridge, because the effective width of the index guide changes according to the intensity of the plasma effect in the central part so that, by the change of the effective width, the accordance of the index mode at the bodes ends and the gain mode in the central part is shifted and a large surge in the mode may be generated according to the amount of the injection current.

However, in the second embodiment, because the concave portions 33 are formed in the vicinity of both ends in the width direction of the ridge 29 and the narrow-stripe ridge portions 29A and 29C are provided at both ends of the broad-area ridge portion 29B, the current is actively injected into the gain region in the central part from the broad-area ridge portion 29B, and the amount of current injected into the index regions at both ends from the narrow-stripe ridge portions 29A and 29C is reduced. Thus, the intensity of the transverse mode in the gain region in the central part, and the intensity of the transverse mode in the index region at both ends may be in good balance. Thereby, the combination between the both modes is smoothly performed, and this enables that the transverse mode in the index region at both ends is suppressed from being distorted, and the gain in the central part increases. Also, by the index guide at both ends, the width of the entire NFP may be controlled within a predetermined range. As a result, the NFP with the stable and uniform shape may be formed as a whole.

Modification of Second Embodiment

Figure 10A:
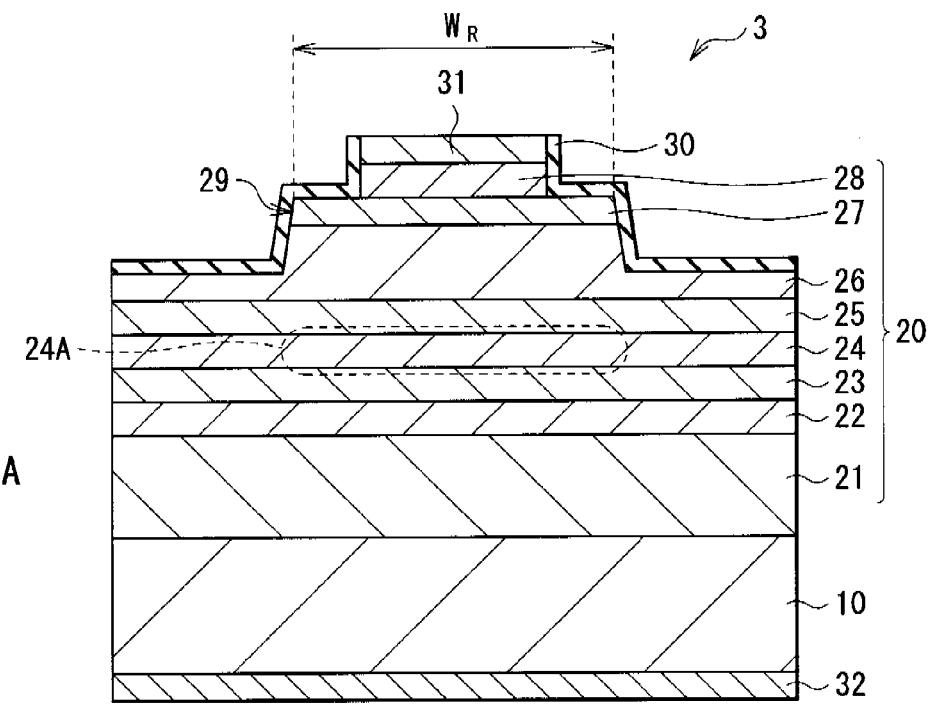
FIGS. 10A and 10B are cross-sectional configuration views of still another modification of the laser diode of FIGS. 5A and 5B.
Figure 10B:
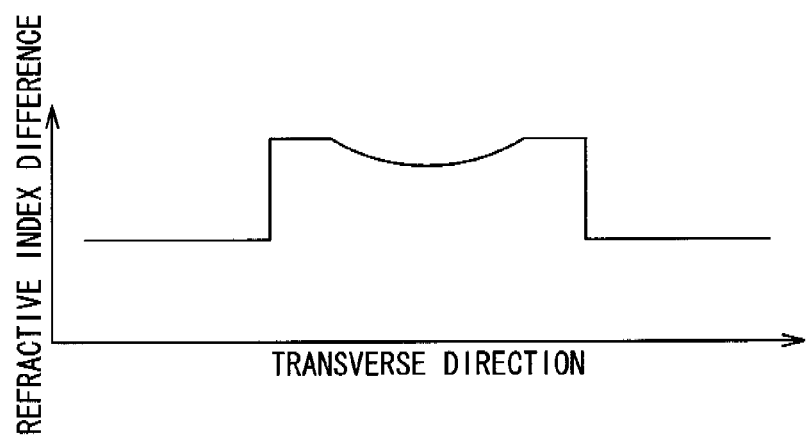

In the second embodiment, the concave portions 33 are formed in the vicinity of both ends in the width direction of the ridge 29, and the narrow-stripe ridge portions 29A and 29C are provided at both ends of the broad-area ridge portion 29B. Thereby, the intensity of the transverse mode in the gain region in the central part and the intensity of the transverse mode in the index region at both ends are in good balance. However, as shown in a laser diode 3 in FIG. 10A, instead of the concave portions 33, a strip-shaped electrode (an upper electrode layer 31) may be provided only on the upper surface of the central part where the ridge portion 29B of the ridge 29 is provided. The refractive index distribution of the laser diode 3 of FIG. 10A is shown in FIG. 10B. Even in this case, the current is actively injected into the gain region in the central part, from the upper electrode layer 31, and the amount of the current injected into the index region at both ends may be reduced. As a result, the NFP with the stable and uniform shape may be formed as a whole.

Figure 11:
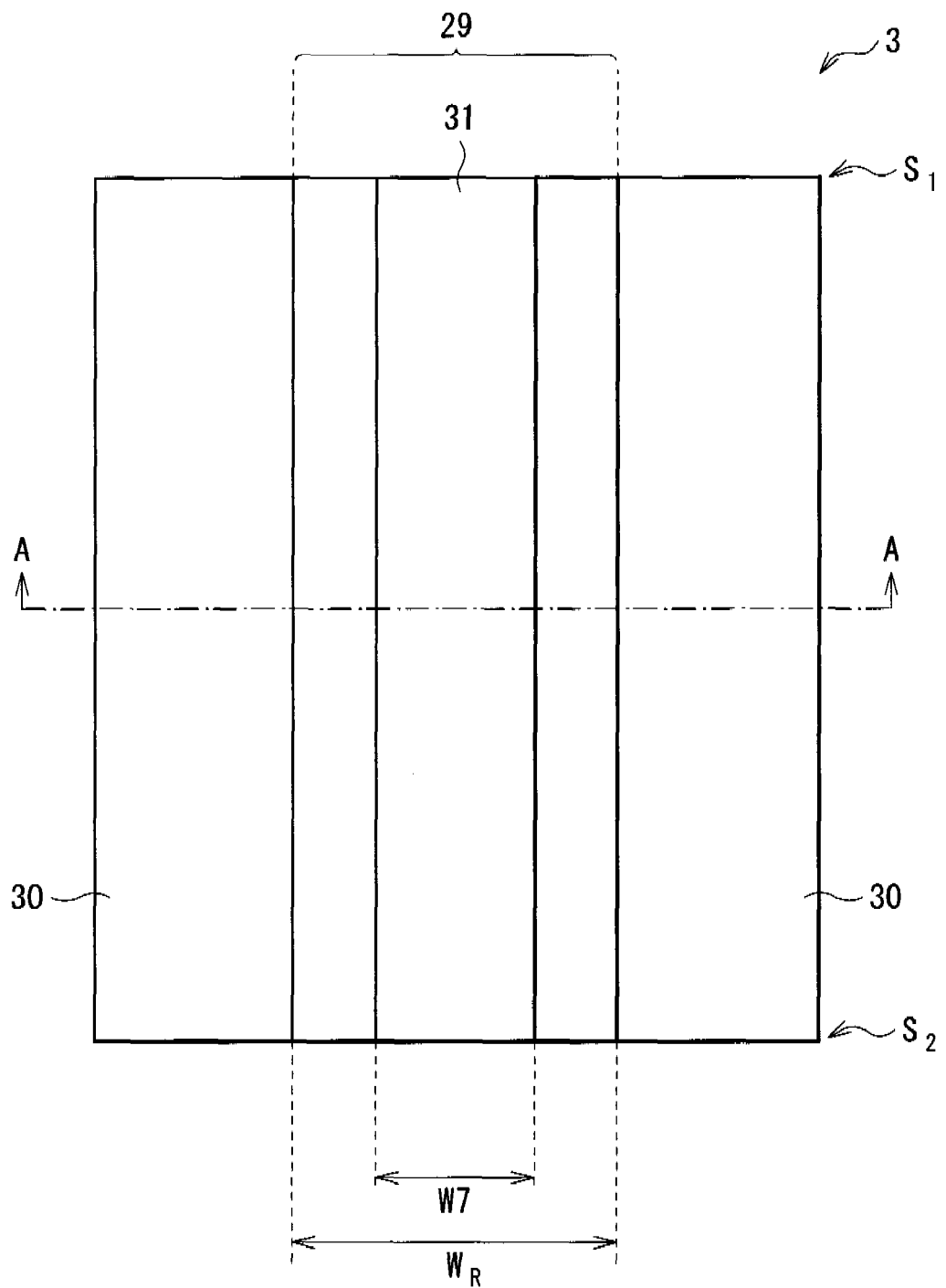
FIG. 11 is an example of a top surface configuration view of the laser diode of FIGS. 10A and 10B.
Figure 12:
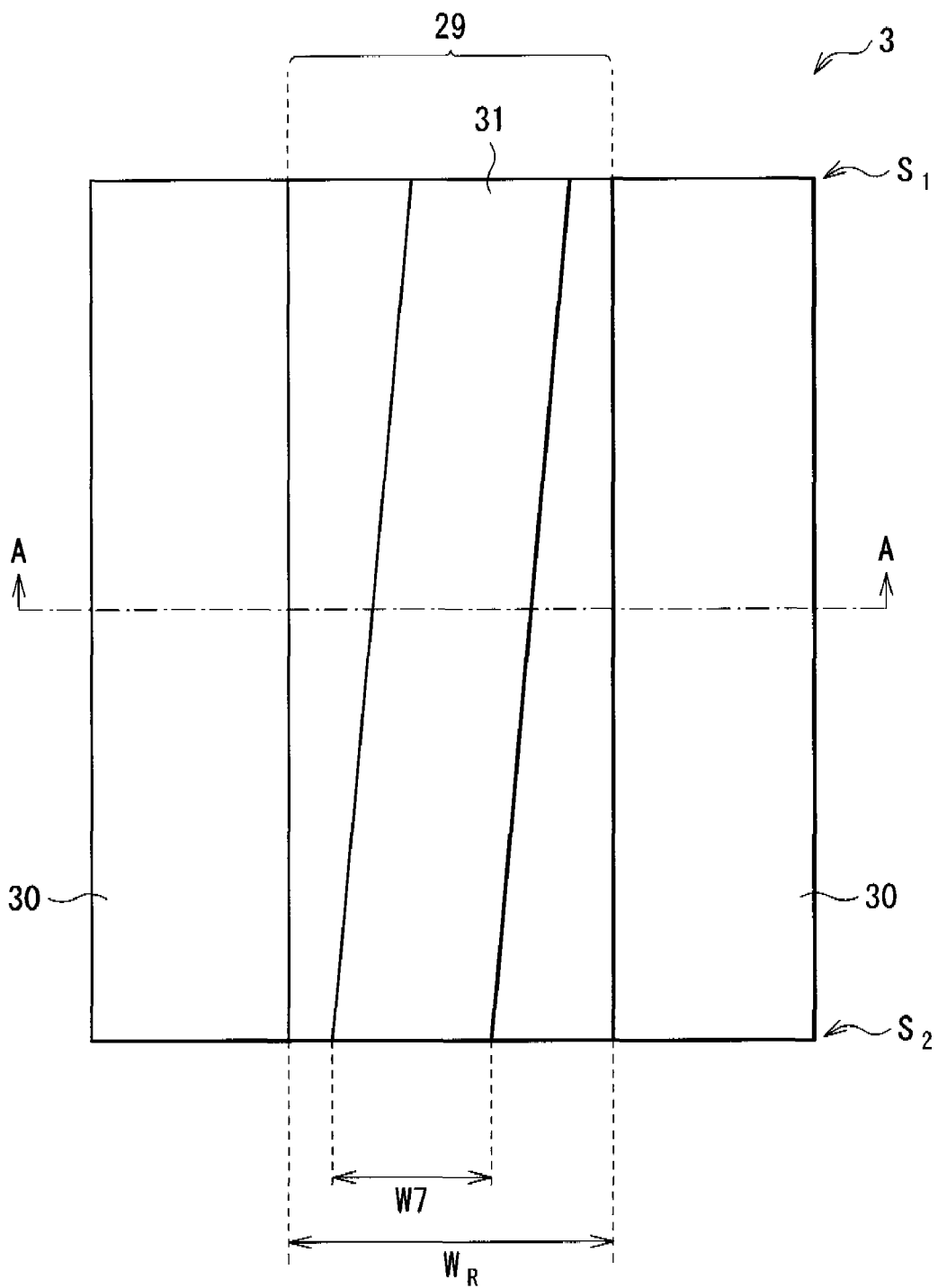
FIG. 12 is another example of the top surface configuration view of the laser diode of FIGS. 10A and 10B.

In the modification of the second embodiment, as shown in FIG. 11 (an example of the top surface configuration of FIG. 10A), the electrode may extend in parallel to the extending direction of the ridge 29. Alternatively, as shown in FIG. 12, (another example of the top surface configuration of FIG. 10A), the electrode may extend in the direction intersecting the extending direction of the ridge 29.

Third Embodiment

Figure 13A:
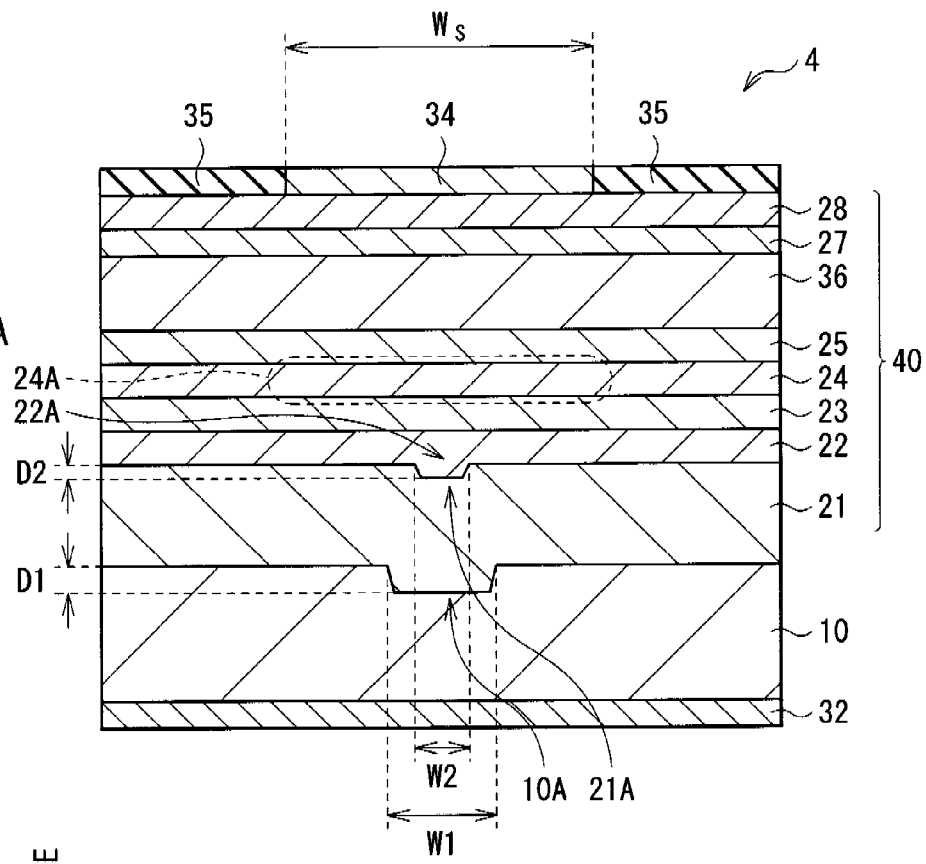
FIGS. 13A and 13B are examples of a cross-sectional configuration view of a laser diode according to a third embodiment of the present invention.
Figure 13B:
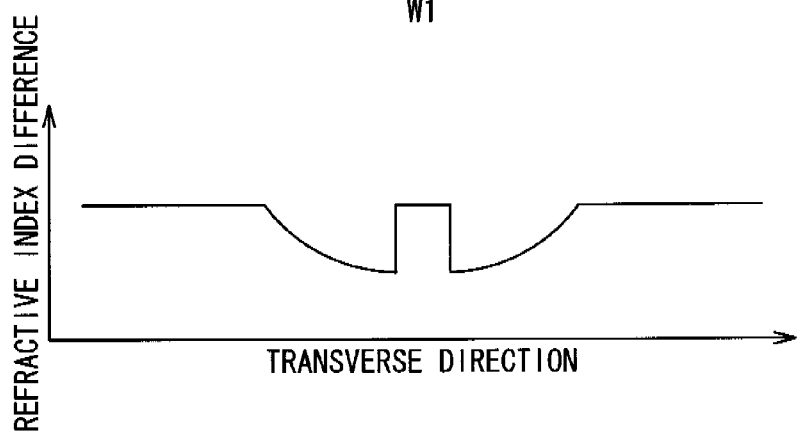
Figure 14:
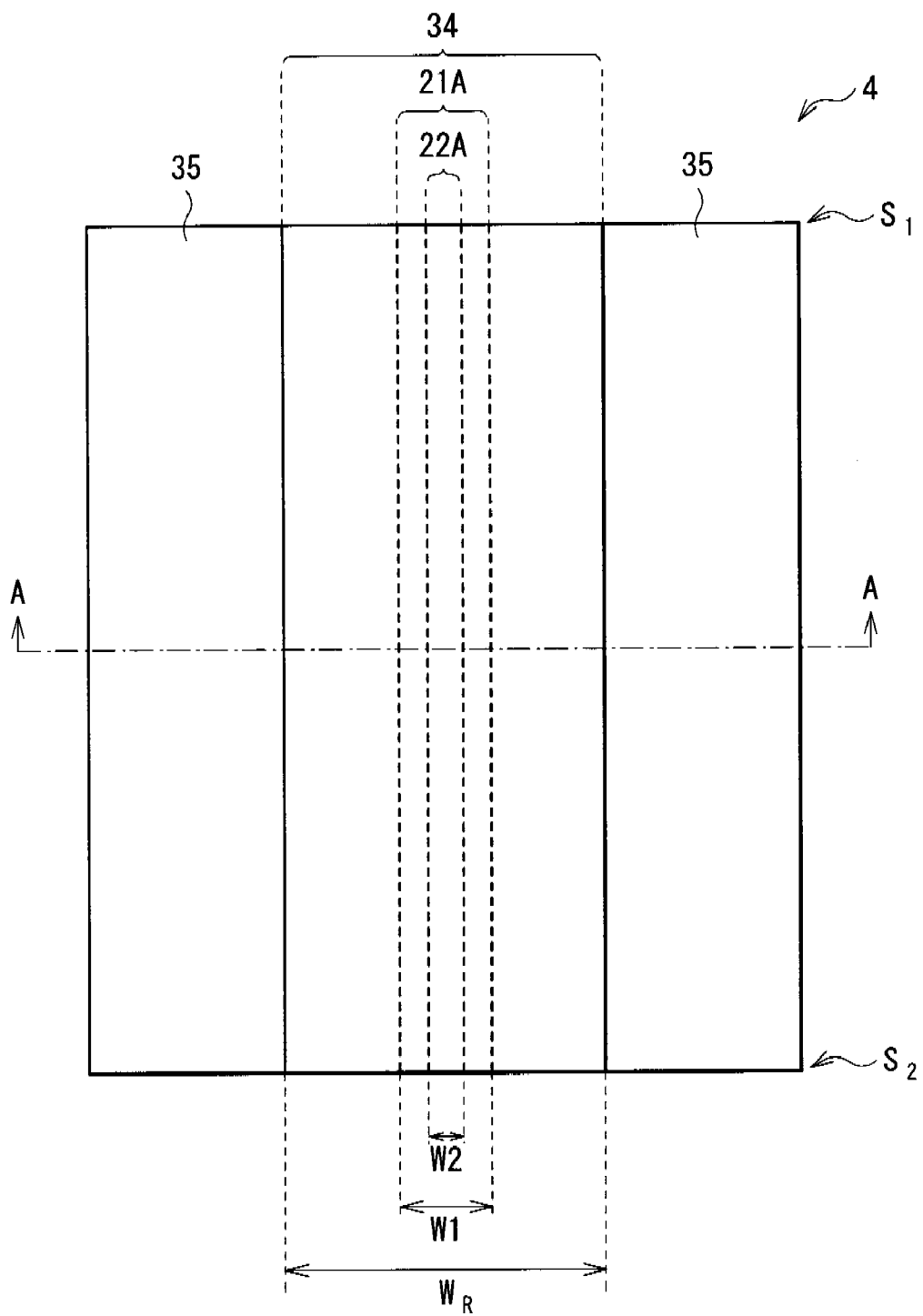
FIG. 14 is an example of a top surface configuration view of the laser diode of FIGS. 13A and 13B.

FIG. 13A illustrates a cross-sectional configuration of a laser diode 4 according to a third embodiment of the present invention. FIG. 13B shows a refractive index distribution of the laser diode 4 of FIG. 13A. FIG. 14 shows an example of a top surface configuration of the laser diode 4 of FIG. 13A. In addition, FIG. 13A corresponds to the cross-sectional configuration view as viewed from the direction of an arrow A-A of FIG. 14. The laser diode 4 is a gain guided laser including, instead of the ridge 29 in the first embodiment, a strip-shaped upper electrode layer 34 (current injection region), and a pair of insulating layers 35 (high resistance regions) sandwiching the upper electrode layer 34 from the width direction of the upper electrode layer 34, the upper electrode layer 34 and the pair of insulating layers 35 disposed in the upper part of a semiconductor layer 20 (stacked structure). The laser diode 4 is also a broad-area laser in which a width $W_S$ of the upper electrode layer 34 is wide (at least 5 μm or above).

The upper electrode layer 34 is, for example, formed by stacking titanium (Ti), platinum (Pt), and gold (Au) in this order on a contact layer 28, and is electrically connected to the contact layer 28. The upper electrode layer 34 is formed in a stripe and flat shape extending in an emitting direction (axis direction) of a laser light, and form a current confinement structure together with the pair of insulating layers 35. The insulating layers 35 are, for example, composed of silicon oxide ($SiO_2$).

Figure 15:
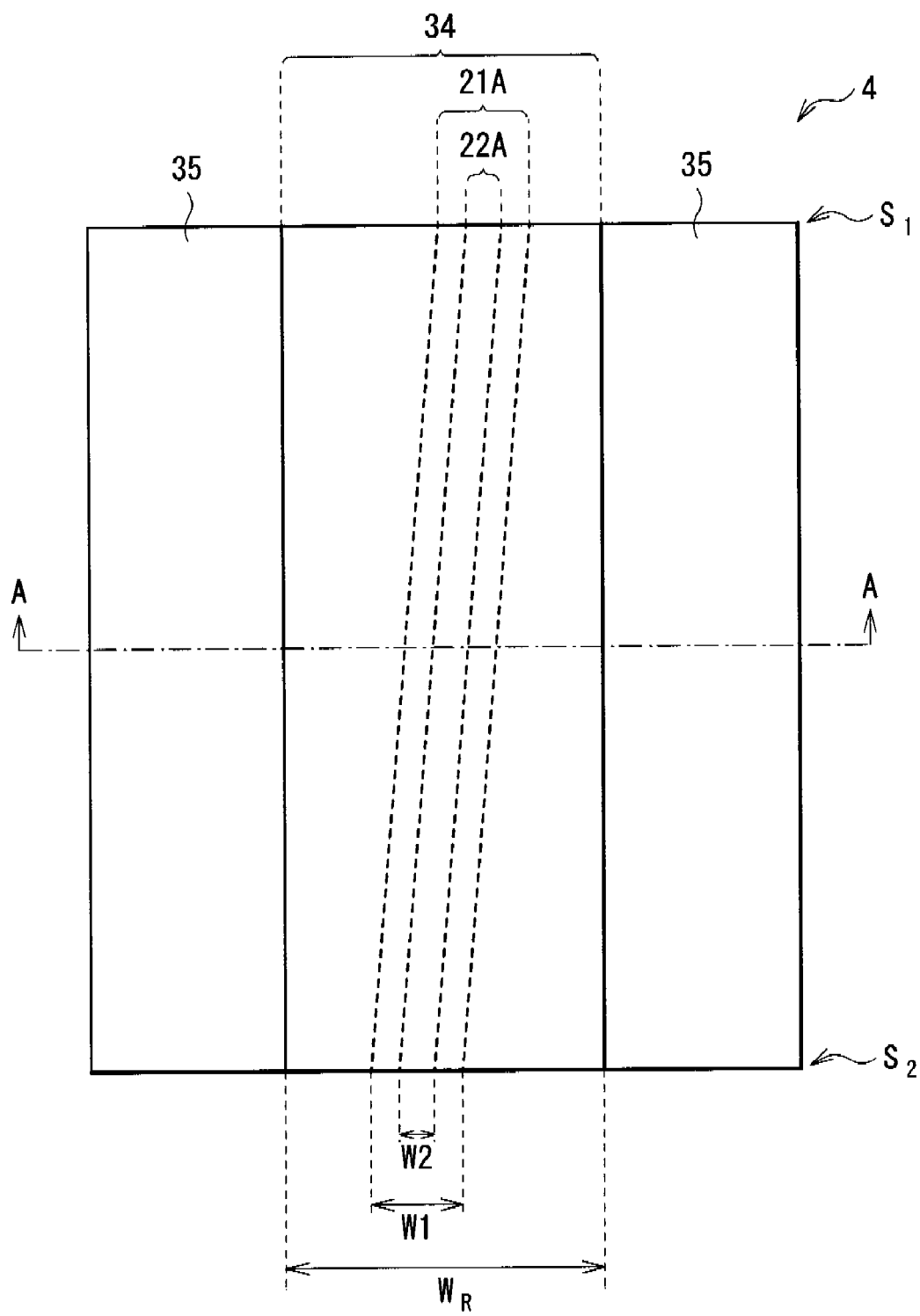
FIG. 15 is another example of the top surface configuration view of the laser diode of FIGS. 13A and 13B.

In the third embodiment, in an area (facing area) corresponding to the upper electrode layer 34, the concave portion 10A extends in the extending direction of the upper electrode layer 34. As shown in FIG. 14, the concave portion 10A preferably extends in the direction parallel to the extending direction (axis direction) of the upper electrode layer 34. Alternatively, as shown in FIG. 15, in the area facing the upper electrode layer 34, the concave portion 10A may extend in the direction intersecting the extending direction of the upper electrode layer 34. As shown in FIG. 14, the concave portion 10A is preferably formed in the area facing the central part in a width direction (transverse direction) of the upper electrode layer 34. Alternatively, the concave portion 10A may be formed in the area except the area facing the central part in the width direction (transverse direction) of the upper electrode layer 34.

Due to the rib structure constructed by a concave portion 21A and a convex portion 22A, the concave portion 21A of a lower cladding layer 21 has a depth $D_2$ and a width $W_2$ which produce a change on an effective refractive index distribution in the transverse direction by the current confinement structure. The depth $D_2$ is preferably from 50 nm to 100 nm, and the width $W_1$ (width of the aperture) is preferably from 5 μm to 10 μm.

As shown in FIG. 14, in the case where the concave portion 10A is formed in the area facing the central part in the width direction of the upper electrode layer 34, the concave portion 21A is also formed in the area facing the central part in the width direction of the upper electrode layer 34. As shown in FIG. 15, in the area facing the upper electrode layer 34, in the case where the concave portion 10A extends in the direction intersecting the extending direction of the upper electrode layer 34, the concave portion 21A also extends in the direction intersecting the extending direction of the upper electrode layer 34.

Due to the rib structure constructed by the concave portion 21A and the convex portion 22A, the convex portion 22A of the first lower guide layer 22 has a height (the depth $D_2$) and a width (the width $W_2$) which produce a change on the effective refractive index distribution in the transverse direction by the current confinement structure. The height is preferably from 50 nm to 100 nm, and the width (width of the bottom of the convex) is preferably from 5 μm to 10 μm. In the rib structure, the difference (refractive index difference) between the refractive index on the lower cladding layer 21 side and the refractive index on the first lower guide layer 22 side is preferably 0.1 or above.

In the active layer 24, the area facing the upper electrode layer 34 is a light emitting region 24A. The light emitting region 24A has a stripe width as the same size as that of the upper electrode layer 34 facing the light emitting region 24A. The light emitting region 24A is coincident with a current injection region into which the current confined by the current confinement structure is injected.

Each of an upper cladding layer 26, an intermediate layer 27, and the contact layer 28 is formed in a flat shape without concave and convex. On the flat surface of the contact layer 28, the upper electrode layer 34 and the pair of insulating layers 35 are formed. The upper electrode layer 34 may extend onto the surface of the insulating layers 35. However, in this case, a portion of the upper electrode layer 34 which is in contact with the contact layer 28 construct the current confinement structure together with the insulating layers 35.

In the laser diode 4 according to the third embodiment, when a predetermined amount of voltage is applied between the lower electrode layer 32 and the upper electrode layer 34, the current is confined by the current confinement structure (hereafter, simply referred to as the current confinement structure) constructed by the upper electrode layer 34 and the pair of insulating layers 35, and the current is injected into the current injection region (light emitting region 24A) of the active layer 24. Thereby, an electron and a hole are recombined so that light emitting is generated. This light is guided in the semiconductor layer 20 by a waveguide structure corresponding to the refractive index distribution formed by the current confinement structure and the convex portion 22A. The light is also reflected by a pair of cleavage planes (a front end face $S_1$ and a rear end face $S_2$) (refer to FIG. 14) facing each other in the extending direction (axis direction) of the current confinement structure. While the light moves back and forth between the pair of cleavage planes, a laser oscillation is generated at a predetermined wavelength, and thereby a laser beam is emitted outside from the cleavage planes.

In a typical laser diode including the gain guided structure, due to the refractive index difference in the transverse direction by the current confinement structure, the light emitted in the light emitting region of the active layer is confined from the transverse direction in a light waveguide. At this time, in the case where an amount of current within the range from the oscillation threshold value current up to twice the oscillation threshold value current is injected into the active layer, an hermite-gaussian mode is exhibited in sequence from a low-order mode to be overlapped (refer to T. Asamatsu et al., Proceedings of SPIE, Vol. 6104, 61040C (2006)). In this case, the uniformity of the transverse mode is superior in comparison with the case of the index guide type, and the NFP is close to the top-hat shape. However, when an amount of current over twice the oscillation threshold value current is injected into the active layer, the transverse mode is disordered, and the NFP is in an incomplete top-hat shape. Further, filament emission may be generated and the mode fluctuation may be produced.

On the other hand, in the third embodiment, the strip-shaped convex portion 22A extending in the extending direction of the current confinement structure is provided in the light waveguide region (the second lower guide layer 23) of the semiconductor layer 20. Thereby, as shown in FIG. 13B, because a narrow-stripe index guide formed by the convex portion 22A is applied in a part of the large gain region, when the index guided transverse mode is generated by the convex portion 22A, the transverse mode is induced in the gain region. Then, the transverse mode generated in the index region in the central part formed by the convex portion 22A is combined with the transverse mode induced in the gain region so that the index guide controls the transverse mode induced in the gain region.

Because the transverse mode is gain guided as a whole, the hermite-gaussian mode is exhibited in sequence from the low-order mode to be overlapped. However, the position to be a "seed" of the transverse mode is fixed by the index guide formed by the convex portion 22A. Thus, the transverse mode is relatively stable, and disorder of the transverse mode and fluctuation of the mode are suppressed. Even in the case where an amount of current over twice the oscillation threshold value current is injected into the active layer, the transverse mode with the ordered gain guide may be maintained. As a result, the NFP with the stable and uniform shape may be formed as a whole.

As shown in FIG. 14, in the case where the convex portion 22A is formed in the area facing the central part in the width direction (transverse direction) of the upper electrode layer 34, the stripe of an index guide induction mode and the stripe of a gain guide induction mode become parallel with each other so that there is an advantage that these modes are likely and smoothly combined. As shown in FIG. 15, in the area facing the upper electrode layer 34, in the case where the convex portion 22A extends in the direction intersecting the extending direction (axis direction) of the upper electrode layer 34, formation of a peak of a certain spatial periodicity is suppressed within the whole transverse mode, and thus the top-hat shape is easily formed as a whole since various modes are excited at the same time.

Modification of Third Embodiment

In the third embodiment, although one convex portion 22A (the concave portion 21A and the concave portion 10A) is formed, two or more convex portions 22A may be formed. For example, in the case where the two convex portions 22A are provided as shown in FIG. 16A, a space Wi between the two convex portions 22A may have a width larger than a width (a width of a portion of an upper electrode layer 34 which is in contact with a contact layer 28) of an upper electrode layer 34. FIG. 16B shows a refractive index distribution of the laser diode of FIG. 16A.

In this case, the width of the transverse mode is defined by the space Wi, and the width of the transverse mode is suppressed from being larger than the space Wi. For example, in the case where the two convex portions 22A are provided, the width of the space Wi between the two convex portions 22A may be almost equal to the width (a width of a portion of the upper electrode layer 34 in contact with the contact layer 28) of the upper electrode layer 34. In this case, the transverse mode close to the ridge-shaped index guide may be formed. For example, in the case where the two convex portions 22A are provided, the space Wi may be smaller than the width (a width of a portion of the upper electrode layer 34 in contact with the contact layer 28) of the upper electrode layer 34. In this case, the two index guides control the transverse mode induced in the gain region. In this manner, because both of the transverse modes are cooperatively combined with each other, the transverse mode generated in the gain region loses controllability and becomes easy to be controlled. As a result, the NFP with the stable and uniform shape may be formed as a whole.

Figure 17A:
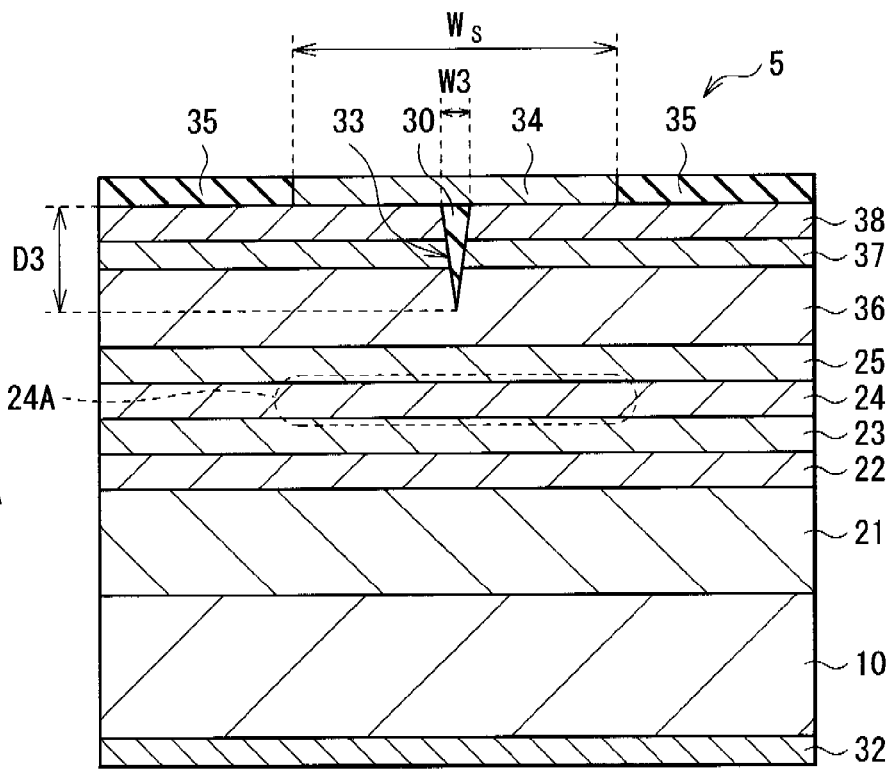
FIGS. 17A and 17B are cross sectional configuration views of another modification of the laser diode of FIGS. 13A and 13B.
Figure 17B:
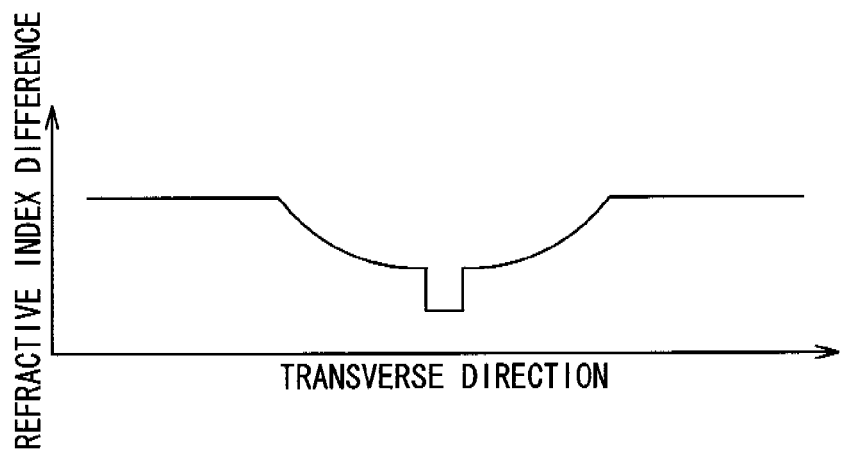
Figure 18:
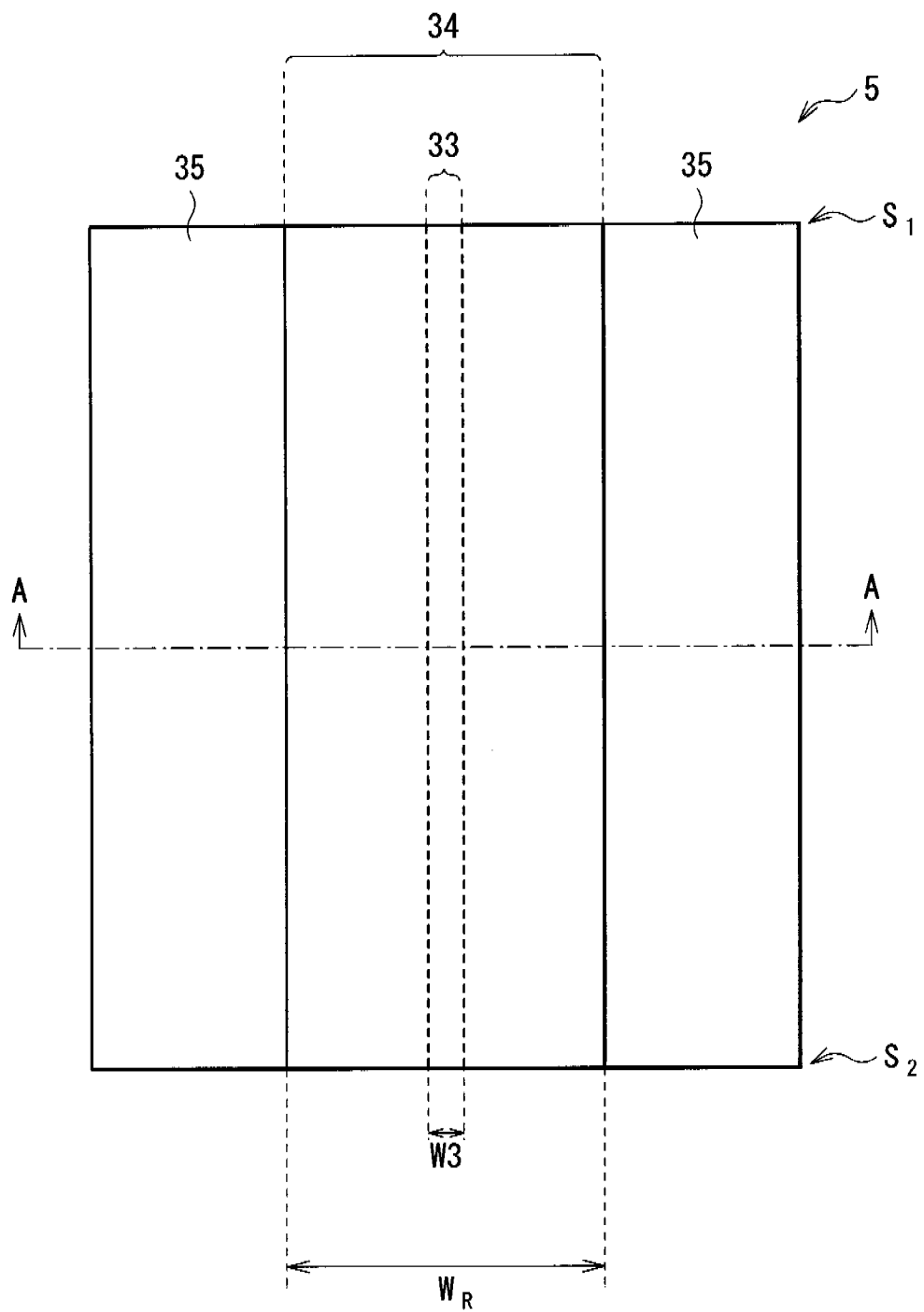
FIG. 18 is an example of a top surface configuration view of the laser diode of FIGS. 17A and 17B.
Figure 19:
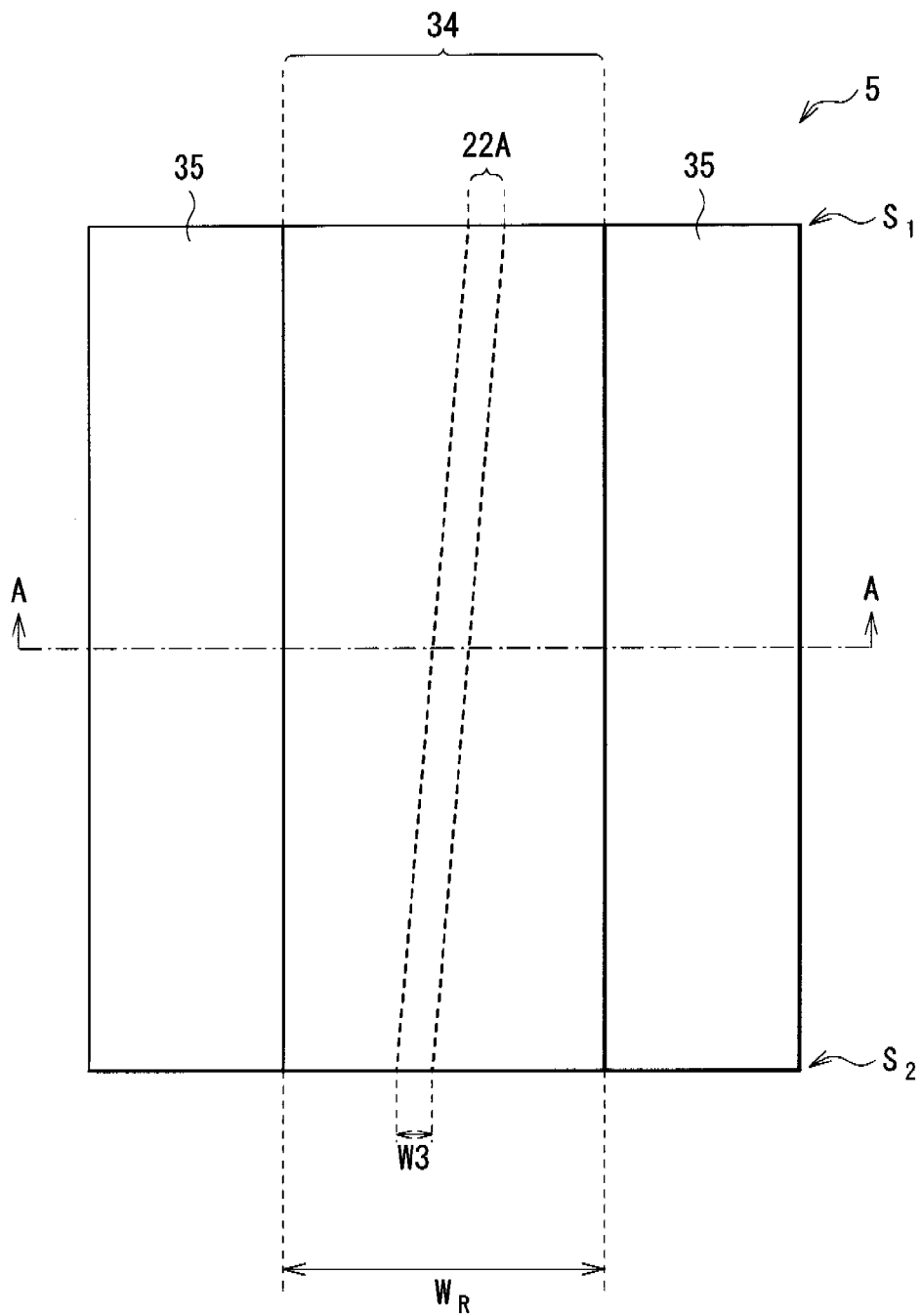
FIG. 19 is another example of the top surface configuration view of the laser diode of FIGS. 17A and 17B.

In the third embodiment, although the convex portion 22A, the concave portion 21A, and the concave portion 10A are provided, similarly to the second embodiment, instead of providing the convex portion 22A, the concave portion 21A, and the concave portion 10A, a concave portion 33 may also be provided immediately below the upper electrode layer 34 as shown in a laser diode 5 of FIGS. 17A and 18 (or FIG. 19). FIG. 17B shows the refractive index distribution of the laser diode of FIG. 17A. In this case, as shown in FIG. 17B, because the gain mode is fixed by the anti-guiding effect in which the gain guide mode is formed by one convex portion 33, the transverse mode generated in the gain region loses controllability and becomes easy to be controlled. As a result, the NFP with the stable and uniform shape may be formed as a whole.

Figure 20A:
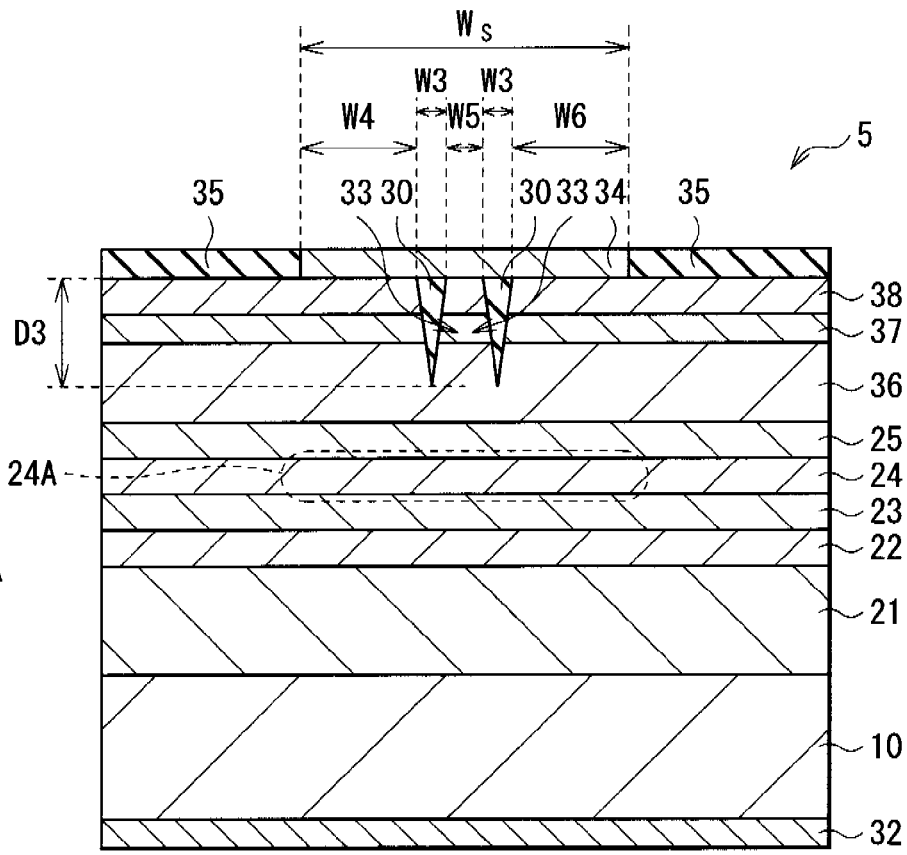
FIGS. 20A and 20B are cross sectional configuration views of still another modification of the laser diode of FIGS. 13A and 13B.
Figure 20B:
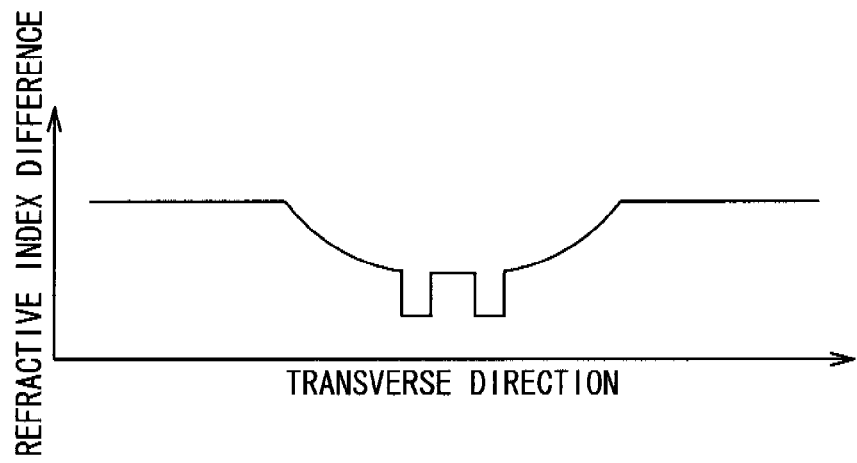

In the third embodiment, instead of providing the convex portion 22A, the concave portion 21A, and the concave portion 10A, two concave portions 33 may be provided immediately below the upper electrode layer 34 as shown in FIG. 20A. FIG. 20B shows the refractive index distribution of the laser diode of FIG. 20A. In this case, as shown in FIG. 20B, a narrow-stripe index guide formed by the ridge shape sandwiched between the two concave portions 33 is applied in the gain region in the large central part. Thus, when the index guided transverse mode is generated by the ridge shape, the transverse mode is induced in the gain region. Then, the transverse mode generated in the index region in the central part formed by the ridge shape, and the transverse mode induced in the gain region are combined with each other so that the ridge-shaped index guide controls the transverse mode induced in the gain region. In this manner, because both of the transverse modes are cooperatively combined with each other, the transverse mode generated in the gain region loses controllability and becomes easy to be controlled. As a result, the NFP with the stable and uniform shape may be formed as a whole.

Figure 21:
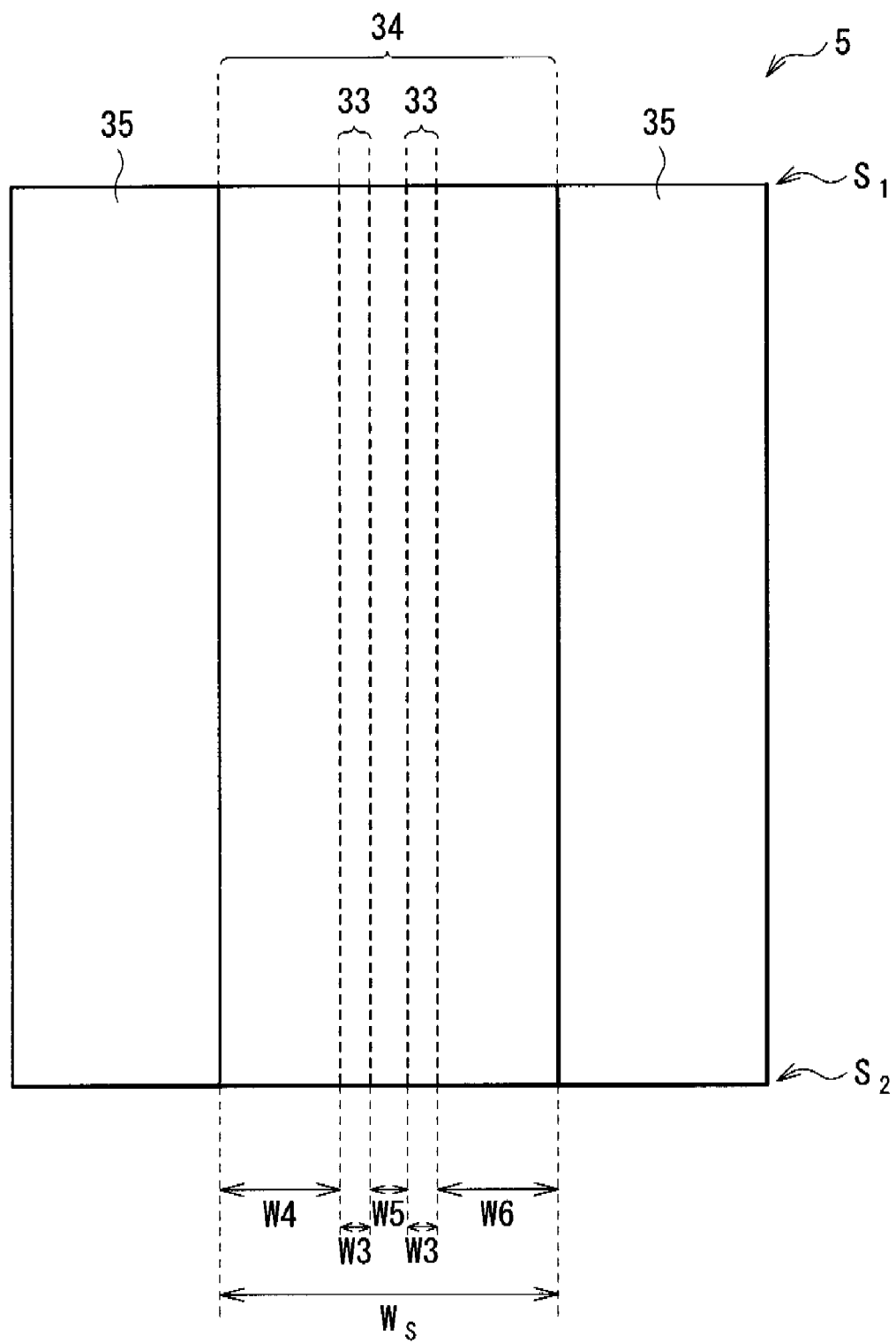
FIG. 21 is am example of a top surface configuration view of the laser diode of FIGS. 20A and 20B.
Figure 22:
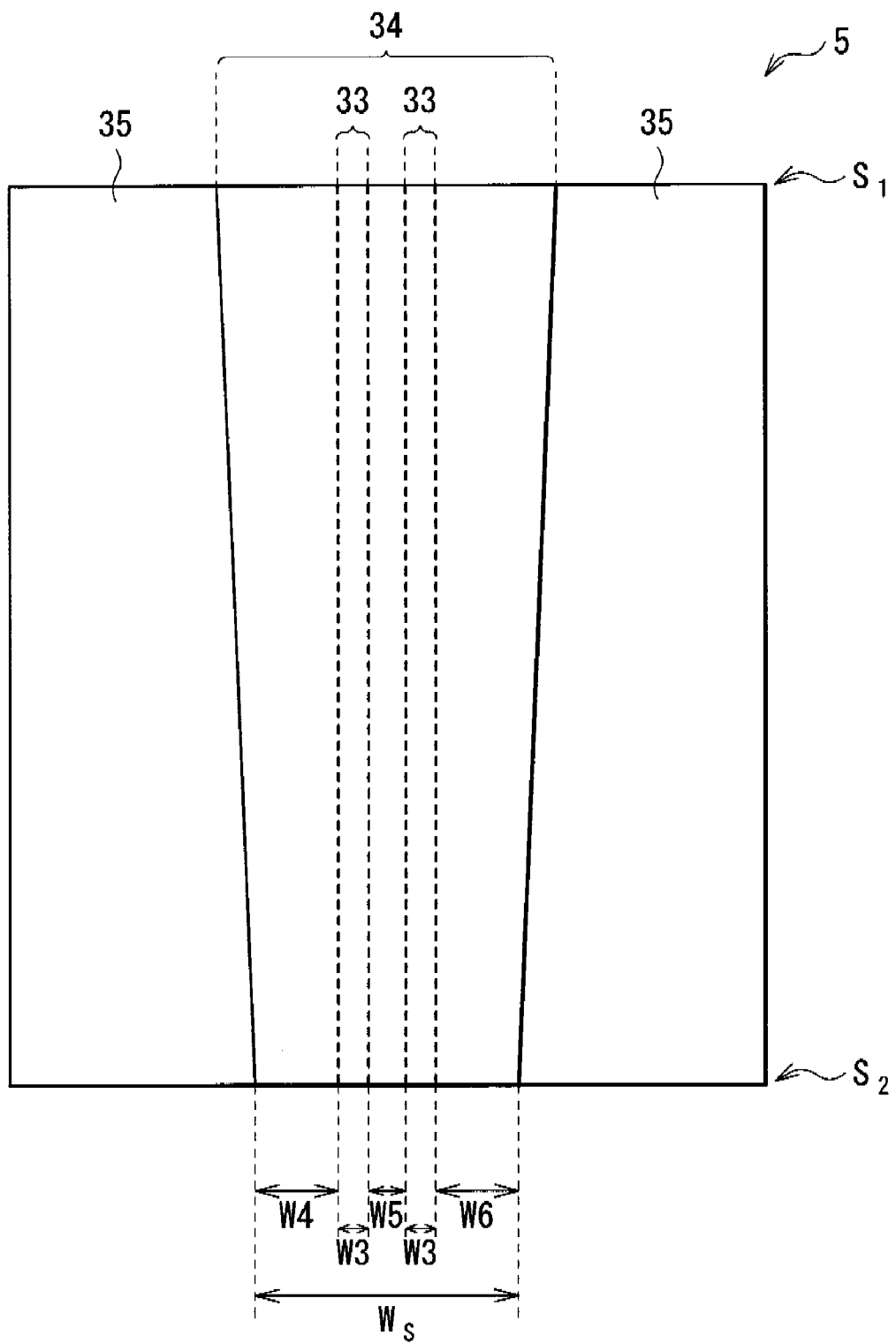
FIG. 22 is another example of the top surface configuration view of the laser diode of FIGS. 20A and 20B.
Figure 23:
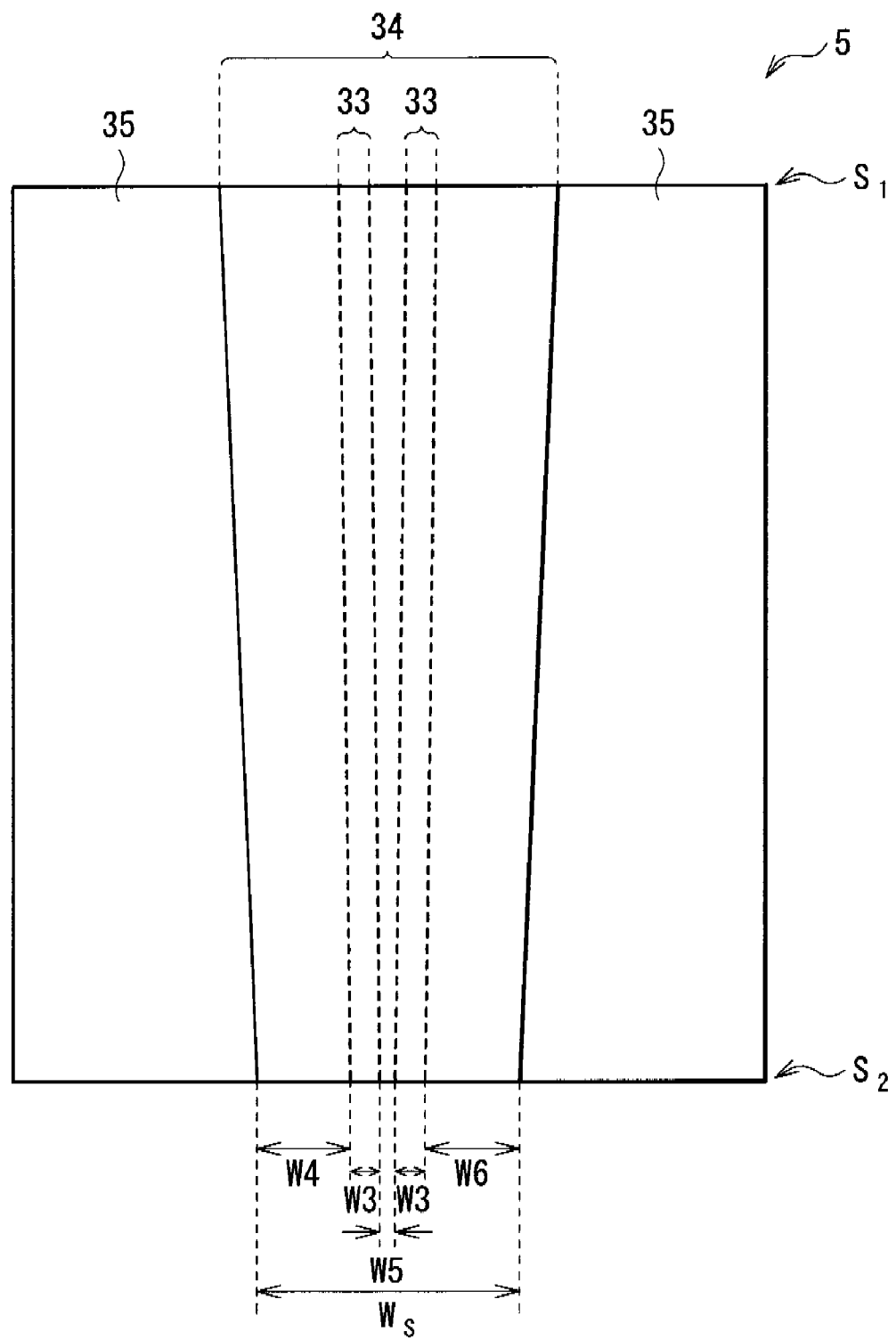
FIG. 23 is still another example of the top surface configuration view of the laser diode of FIGS. 20A and 20B.

However, in this case, as shown in FIG. 21, the concave portions 33 preferably extend in the direction parallel to the extending direction (axis direction) of the upper electrode layer 34. As shown in FIG. 22, in the area facing the upper electrode layer 34, the width of the upper electrode layer 34 may be decreased toward a rear end face S2 from a front end face S1. As shown in FIG. 23, in the area facing the upper electrode layer 34, a space between the two concave portions 33 may be decreased toward the rear end face S2 from the front end face S1. In both of the cases of FIGS. 22 and 23, formation of the transverse mode is modulated in a resonator length direction so that there is no risk that light intensity in only a specific region increases as the amount of current increases. As a result, the spatial hole-burning and filament emission may be suppressed.

Figure 24:
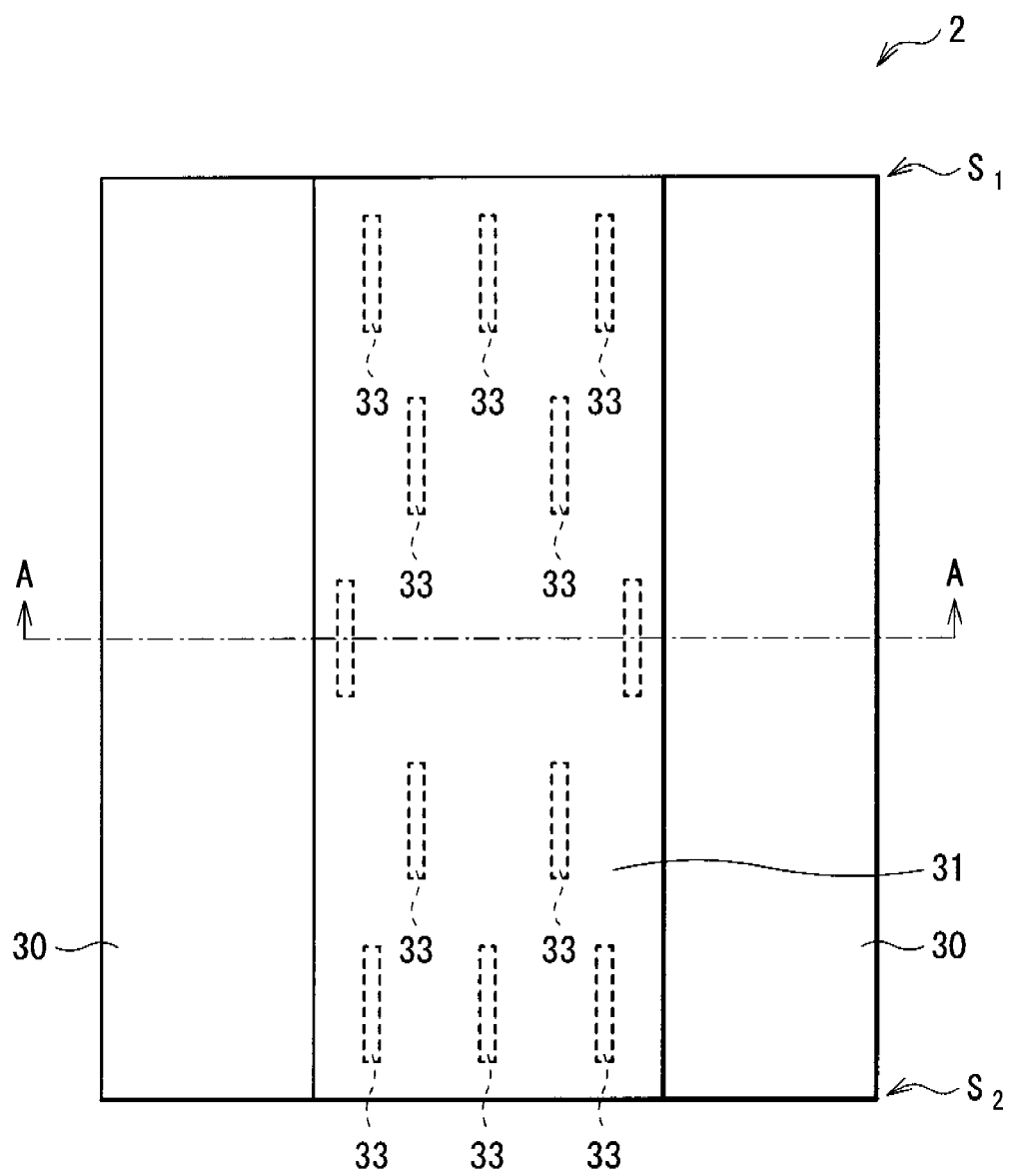
FIG. 24 is a top surface configuration view of still another modification of the laser diode of FIGS. 13A and 13B.

In the third embodiment, as shown in FIG. 24, instead of providing the convex portion 22A, the concave portion 21A, and the convex portion 10A, a plurality of concave portions 33 immediately below the upper electrode layer 34 may be arranged in the extending direction of the upper electrode layer 34 and in the width direction of the upper electrode layer 34 as well. In this case, the concave portions 33 may be uniformly arranged in two dimensions, or may be nonuniformly arranged in two dimensions.

Hereinbefore, although the present invention is described with the embodiments and the modifications, the present invention is not limited to these and various modifications are available.

For example, in the embodiments, the present invention is described with an example of the laser diode of AlGaInP type compound. However, the present invention is also applicable to a laser diode of other compounds, for example, a red laser diode such as AlInP type and GaInAsP type, a laser diode of gallium nitride such as GaInNtype and AlGaInN type and a laser diode of II-VI group such as ZnCdMgSSeTe. The present invention is also applicable to a laser diode in which the oscillation wavelength is not limited to a visible range, such as AlGaAs type, InGaAs type, InP type, and GaInAsNP type.

It should be understood by those skilled in the art that various modifications, combinations, sub-combinations and alterations may occur depending on design requirements and other factors insofar as they are within the scope of the appended claims or the equivalents thereof.

What is claimed is:
1. A laser diode comprising:
   an active layer; and
   a stacked structure including one or a plurality of strip-shaped current confinement structures confining a current which is injected into the active layer,
   wherein,
   the current confinement structure is in a ridge shape, the current confinement structure includes at least one strip-shaped concave portion extending in an extending direction of the current confinement structure, the concave portion disposed in an upper part of the ridge shape, and an electrode layer covers an entire surface of the upper part of the ridge shape including the at least one concave portion.

2. The laser diode according to claim 1, wherein a width of the concave portion is between and including 2 μm and 5 μm.

3. The laser diode according to claim 1, wherein a depth of the concave portion is almost equal to or smaller than a height of the current confinement structure.

4. A laser diode comprising:
an active layer; and
a stacked structure including one or a plurality of strip-shaped current confinement structures confining a current which is injected into the active layer,
wherein,
the current confinement structure is in a ridge shape, and the current confinement structure includes one or a plurality of strip-shaped concave portions extending in an extending direction of the current confinement structure, the concave portions disposed in an upper part of the ridge shape, and
the concave portion is formed in a central part in a width direction of the current confinement structure.

5. The laser diode according to claim 4, wherein a plurality of the concave portions are formed, and respective spaces between the concave portions is between and including 2 μm and 5 μm.

6. The laser diode according to claim 1, wherein the concave portion is formed in an area except a central part in the width direction of the current confinement structure.

7. The laser diode according to claim 6, wherein a plurality of the concave portions are formed and the concave portions are formed in both of a pair of areas sandwiching the central part, a space between the concave portion formed in one of the pair of areas sandwiching the central part, and one of end edges in a width direction of an upper part of the current confinement structure is between and including 2 μm and 5 μm, and a space between the concave portion formed in the other of the pair of areas sandwiching the central part, and the other of end edges in a width direction of the upper part of the current confinement structure is between and including 2 μm and 5 μm.

8. The laser diode according to claim 1, wherein the concave portion is line-symmetrically formed with respect to a central axis in the width direction of the current confinement structure.

9. The laser diode according to claim 1, wherein the concave portion extends in a direction parallel to the extending direction of the current confinement structure.

10. The laser diode according to claim 1, wherein the concave portion extends in the direction intersecting the extending direction of the current confinement structure.

11. The laser diode according to claim 1, wherein a plurality of the concave portions are formed, and the concave portions are arranged in the width direction of the current confinement structure and in the extending direction of the current confinement structure.

12. The laser diode according to claim 10, wherein the concave portions are nonuniformly arranged.

13. A laser diode comprising:
an active layer; and
a stacked structure including one or a plurality of strip-shaped current confinement structures confining a current which is injected into the active layer,
wherein the current confinement structure includes a pair of high resistance regions with a current injection region in between, and includes one or a plurality of strip-shaped concave portions extending in an extending direction of the current injection region, the concave portions disposed in a central part in a width direction of the current injection region.

14. The laser diode according to claim 13, wherein a width of the concave portion is between and including 2 μm and 5 μm.

15. The laser diode according to claim 13, wherein a plurality of the concave portions are formed, and respective spaces between the concave portions is between and including 2 μm and 5 μm.

16. The laser diode according to claim 13, wherein the concave portion is line-symmetrically formed with respect to a central axis in the width direction of the current injection region.

17. The laser diode according to claim 13, wherein the concave portion extends in a direction parallel to the extending direction of the current injection region.

18. The laser diode according to claim 13, wherein the concave portion extends in the direction intersecting the extending direction of the current injection region.

19. The laser diode according to claim 13, wherein two convex portions are formed, and a space between the convex portions is uniform in the extending direction of the current injection region.

20. The laser diode according to claim 13, wherein two concave portions are formed, and a space between the concave portions in the extending direction of the current injection region increases mainly towards an emitting direction of light.

21. The laser diode according to claim 13, wherein two concave portions are formed, and a space between the concave portions is uniform in the extending direction of the current injection region, and a width of the current injection region increases mainly towards the emitting direction of light.

22. A laser diode comprising:
an active layer; and
a stacked structure including one or a plurality of strip-shaped current confinement structures confining a current which is injected into the active layer,
wherein,
the current confinement structure is in a ridge shape, and the current confinement structure includes a contact layer having a width smaller than the width of an upper part of the current confinement structure, the contact layer disposed in an upper part of the ridge shape, and
the current confinement structure includes one or a plurality of strip-shaped concave portions extending in the extending direction of the current confinement structure, the concave portion disposed in the contact layer and in positions immediately below the contact layer.

* * * * *